United States Patent
Kawasaki et al.

(10) Patent No.: US 9,294,047 B2
(45) Date of Patent: Mar. 22, 2016

(54) POWER AMPLIFIER APPARATUS, TRANSMITTER APPARATUS, AND METHOD OF CONTROLLING THE POWER AMPLIFIER APPARATUS

(71) Applicant: FUJITSU LIMITED, Kawasaki-shi, Kanagawa (JP)

(72) Inventors: Toshio Kawasaki, Kawasaki (JP); Hiroyoshi Ishikawa, Yokohama (JP); Kazuo Nagatani, Yokohama (JP); Yuichi Utsunomiya, Kawasaki (JP); Alexander Nikolaevich Lozhkin, Kawasaki (JP); Hajime Hamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 8 days.

(21) Appl. No.: 14/281,692

(22) Filed: May 19, 2014

(65) Prior Publication Data

US 2014/0347132 A1  Nov. 27, 2014

(30) Foreign Application Priority Data

May 24, 2013 (JP) .................................. 2013-110380
Aug. 29, 2013 (JP) .................................. 2013-178629

(51) Int. Cl.
| H03F 1/26 | (2006.01) |
|---|---|
| H03F 1/32 | (2006.01) |
| H03F 3/21 | (2006.01) |
| H03F 3/24 | (2006.01) |

(52) U.S. Cl.
CPC ............... *H03F 1/3247* (2013.01); *H03F 3/21* (2013.01); *H03F 3/24* (2013.01); *H03F 2201/3227* (2013.01); *H03F 2203/21* (2013.01)

(58) Field of Classification Search
CPC ............................. H03F 1/3241; H03F 1/3247
USPC ........................................ 330/149; 455/114.3
See application file for complete search history.

(56) References Cited

U.S. PATENT DOCUMENTS

| 6,298,097 B1 | 10/2001 | Shalom |
| 2002/0065048 A1 | 5/2002 | Nagatani et al. |
| 2012/0286985 A1 | 11/2012 | Chandrasekaran et al. |

FOREIGN PATENT DOCUMENTS

| JP | 2009-522881 A | 6/2009 |
| JP | 2009-213113 A | 9/2009 |
| JP | 2010-130064 A | 6/2010 |
| JP | 2012-239129 A | 12/2012 |
| WO | WO 01/08320 A1 | 2/2001 |
| WO | WO 2007/079396 A2 | 7/2007 |

OTHER PUBLICATIONS

Extended European Search Report issued in European Patent Application No. 14169069.3 on Jan. 27, 2015.
Korean Office Action of Korean Patent Application 10-2014-61732 dated Nov. 20, 2015.

*Primary Examiner* — Steven J Mottola
(74) *Attorney, Agent, or Firm* — Arent Fox LLP

(57) ABSTRACT

A power amplifier apparatus includes an amplifier configured to amplify an input signal converted into an analog signal, a distortion compensator circuitry configured to perform a pre-distortion process to an input signal at a second sampling rate higher than a first sampling rate at which the input signal is converted into an analog signal, a remover configured to remove a frequency component exceeding a frequency band corresponding to the first sampling rate from the input signal subjected to the pre-distortion process, a first rate converter configured to convert a sampling rate of the input signal from which the frequency component is removed from the second sampling rate to the first sampling rate, and a first signal converter configured to convert the input signal the sampling rate of which is converted into an analog signal at the first sampling rate to supply the input signal converted into the analog signal to the amplifier.

11 Claims, 27 Drawing Sheets

US 9,294,047 B2

POWER AMPLIFIER APPARATUS, TRANSMITTER APPARATUS, AND METHOD OF CONTROLLING THE POWER AMPLIFIER APPARATUS

CROSS-REFERENCE TO RELATED APPLICATIONS

This application is based upon and claims the benefit of priority of the prior Japanese Patent Application Nos. 2013-110380, filed on May 24, and 2013-178629, filed on Aug. 29, 2013, the entire contents of which are incorporated herein by reference.

FIELD

The embodiments discussed herein are related to a power amplifier apparatus, a transmitter apparatus, and a method of controlling the power amplifier apparatus.

BACKGROUND

The bandwidths and dynamic ranges of transmission signals are widened with the increasing speed of wireless communication in recent years. In order to minimize degradation of signal quality in such a situation, it is desirable for power amplifiers to have high linearity. In addition, it is also desirable to provide the power amplifiers that operate at high power conversion efficiency in term of reduction in size of the apparatuses, reduction in operational cost, environmental issues, and so on.

In general power amplifiers, the linearity is inconsistent with the power conversion efficiency. For example, operating the power amplifiers in linear areas backed off from saturated power allows an occurrence of out-of-band distortion to be reduced. However, the power conversion efficiency is considerably reduced to increase the power consumption of the power amplifiers in this case. Accordingly, in order to achieve both the linearity and the power conversion efficiency, the power amplifiers are operated in non-linear areas where the power conversion efficiency is high to keep the linearity by using distortion compensation for removing non-linear distortion occurring when the power amplifiers are operated in the non-linear areas. A pre-distortion method (hereinafter referred to as a "PD method"), which is a mode of the distortion compensation, is a technique in which a transmission signal is multiplied by an inverse characteristic of the non-linear distortion of the power amplifier in advance to improve the linearity in the output from the power amplifier.

An exemplary power amplifier apparatus in related art using the PD method will now be described. FIG. 18 illustrates an exemplary configuration of the power amplifier apparatus in the related art adopting the PD method. Referring to FIG. 18, the power amplifier apparatus includes a transmission signal generator 11, a distortion compensator 12, a digital-to-analog (D/A) converter 13, a quadrature modulator (QMOD) 14, an oscillator 15, a power amplifier 16, and an antenna 17. The power amplifier apparatus also includes a quadrature demodulator (QDEM) 18, an oscillator 19, an analog-to-digital (A/D) converter 20, a subtractor 21, and a coefficient generator 22.

A transmission signal generated by the transmission signal generator 11 is supplied to the distortion compensator 12 where the transmission signal is multiplied by a distortion compensation coefficient. The signal resulting from multiplication of the transmission signal by the distortion compensation coefficient is generated as a pre-distortion signal. The pre-distortion signal includes distortion components having the inverse characteristic of the non-linear distortion of the power amplifier 16. The pre-distortion signal is converted into an analog signal by the D/A converter 13, is up-converted by the QMOD 14 and the oscillator 15, and is supplied to the power amplifier 16. An output signal from the power amplifier 16, from which the non-linear distortion is removed by the pre-distortion process, is branched into two by, for example, a directional coupler. One of the output signals resulting from the branching is transmitted to an external reception apparatus via the antenna 17. The other of the output signals is down-converted by the QDEM 18 and the oscillator 19 and is converted into a digital signal by the A/D converter 20 to generate a feedback signal. The feedback signal and the transmission signal generated by the transmission signal generator 11 are supplied to the subtractor 21. An error signal, which is the difference between the feedback signal and the transmission signal, is calculated by the subtractor 21, the distortion compensation coefficient is generated by the coefficient generator 22 so that the error signal is minimized, and the generated distortion compensation coefficient is supplied to the distortion compensator 12.

For example, refer to International Publication No. WO/2001/008320.

SUMMARY

According to an aspect of the invention, a power amplifier apparatus includes an amplifier configured to amplify an input signal converted into an analog signal, a distortion compensator circuitry configured to perform a pre-distortion process to an input signal at a second sampling rate higher than a first sampling rate at which the input signal is converted into an analog signal, a remover configured to remove a frequency component exceeding a frequency band corresponding to the first sampling rate from the input signal subjected to the pre-distortion process, a first rate converter configured to convert a sampling rate of the input signal from which the frequency component is removed from the second sampling rate to the first sampling rate, and a first signal converter configured to convert the input signal the sampling rate of which is converted into an analog signal at the first sampling rate to supply the input signal converted into the analog signal to the amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A sampling rate at which the pre-distortion signal is generated by the distortion compensator is set to a value equal to a sampling rate at which the signal is converted into the analog signal by the D/A converter in the related art. Accordingly, when the D/A converter having a relatively low sampling rate is used, the sampling rate of the distortion compensator is also reduced. As a result, it is difficult for a frequency bandwidth corresponding to the sampling rate of the distortion compensator (hereinafter referred to as a "distortion compensation bandwidth") to accommodate high-frequency distortion components, among the distortion components of the inverse characteristic of the non-linear distortion of the power amplifier, which appear in the pre-distortion signal. When the high-frequency distortion components appearing the pre-distortion signal are not accommodated in the distortion compensation bandwidth, the high-frequency distortion components that are not accommodated in the distortion compensation bandwidth are turned back into the distortion compensation bandwidth. The high-frequency distortion components turned back into the distortion compensation bandwidth (hereinafter referred to as "aliasing distortion") remain in the output signal from the power amplifier from which the non-linear distortion is removed by the pre-distortion process to cause a problem in that the distortion compensation performance is degraded.

Figure 19:
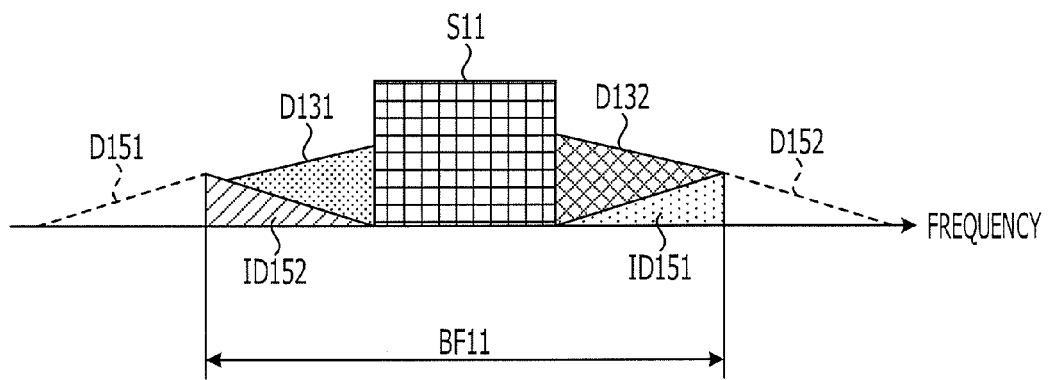
FIG. 19 is a diagram for describing a problem in the related art.
Figure 20:
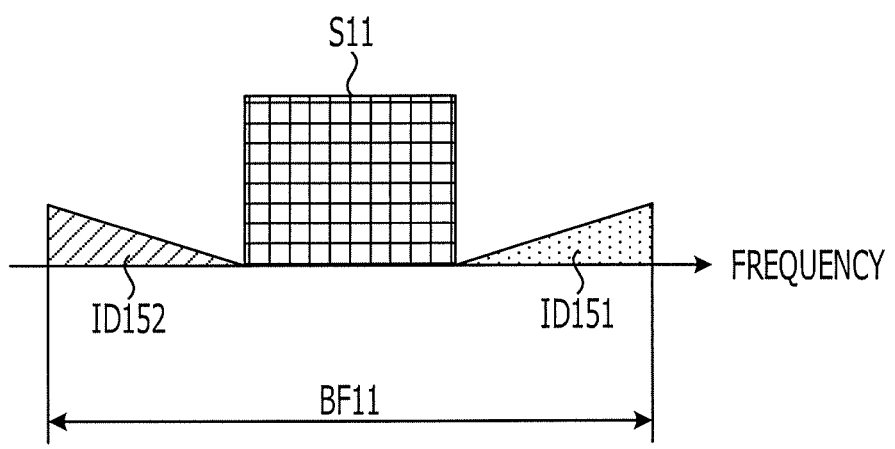
FIG. 20 is a diagram for describing a problem in the related art.

FIG. 19 and FIG. 20 are diagrams for describing the problems in the related art. FIG. 19 illustrates an exemplary waveform of the pre-distortion signal when the high-frequency distortion components appearing in the pre-distortion signal are not accommodated in the distortion compensation bandwidth. FIG. 20 illustrates an exemplary waveform of the output signal from the power amplifier when the high-frequency distortion components appearing in the pre-distortion signal are not accommodated in the distortion compensation bandwidth. The horizontal axis represents frequency and the vertical axis represents power in FIG. 19 and FIG. 20.

In the example illustrated in FIG. 19, the pre-distortion signal includes distortion components D131 and D132 including cubic distortion components and quintic distortion components of a transmission signal S11 and quintic distortion components D151 and D152 of the transmission signal S11 as the distortion components. It is assumed here that a distortion compensation bandwidth BF11 accommodates only the distortion components D131 and D132, among the distortion components appearing in the pre-distortion signal. In this case, as illustrated in FIG. 19, the quintic distortion components D151 and D152 that are not accommodated in the distortion compensation bandwidth BF11 are turned back into the distortion compensation bandwidth BF11 to be aliasing distortion components ID151 and ID152. The aliasing distortion components ID151 and ID152 remains in the output signal from the power amplifier, as illustrated in FIG. 20, to cause the degradation of the distortion compensation performance.

The present disclosed technology provides a power amplifier apparatus, a transmitter apparatus, and a method of controlling the power amplifier apparatus, which are capable of suppressing the degradation of the distortion compensation performance even when the sampling rate of the D/A converter is low.

According to an embodiment of the power amplifier apparatus of the present disclosed technology, it might be possible to advantageously suppress the degradation of the distortion compensation performance even when the sampling rate of the D/A converter is low.

A power amplifier apparatus, a transmitter apparatus, and a method of controlling the power amplifier apparatus according to embodiments will herein be described in detail with reference to the attached drawings. The disclosed technology is not limited by the following embodiments.

First Embodiment

Figure 1:
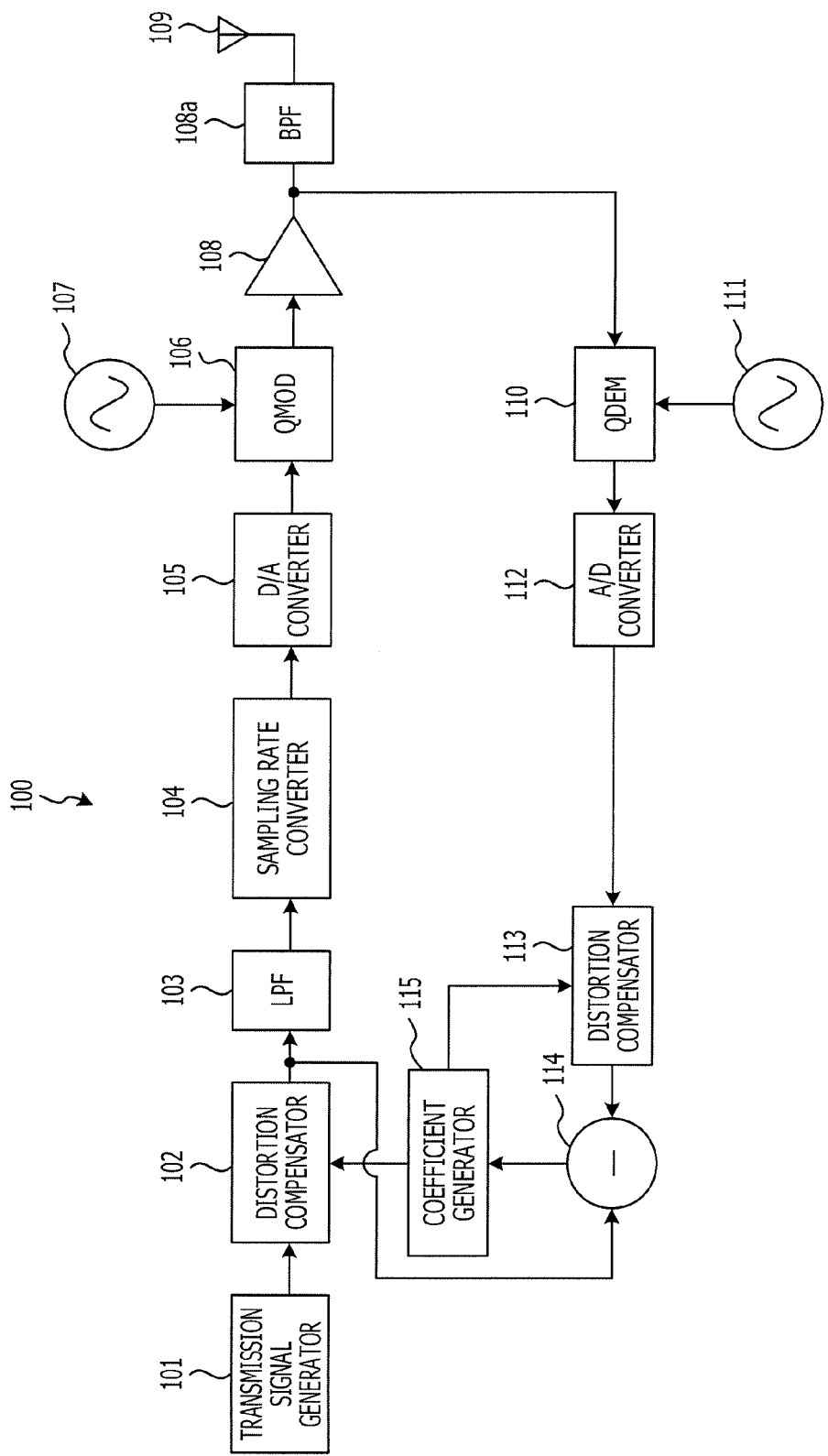
FIG. 1 illustrates an exemplary configuration of a transmitter apparatus according to a first embodiment.

FIG. 1 illustrates an exemplary configuration of a transmitter apparatus according to a first embodiment. Referring to FIG. 1, a transmitter apparatus 100 according to the first embodiment includes a transmission signal generator 101, a distortion compensator 102, a low pass filter (LPF) 103, a sampling rate converter 104, and a digital-to-analog (D/A) converter 105. The transmitter apparatus 100 also includes a quadrature modulator (QMOD) 106, an oscillator 107, a power amplifier 108, a band pass filter (BPF) 108a, and an antenna 109. The transmitter apparatus 100 further includes a quadrature demodulator (QDEM) 110, an oscillator 111, an analog-to-digital (A/D) converter 112, a distortion compensator 113, a subtractor 114, and a coefficient generator 115. The distortion compensator 102, the LPF 103, the sampling rate converter 104, the D/A converter 105, the QMOD 106, the oscillator 107, and the power amplifier 108 compose an example of a "power amplifier apparatus".

The transmission signal generator 101 modulates a baseband signal to generate a carrier (a carrier wave), which is a transmission signal. The transmission signal generator 101 supplies the generated transmission signal to the distortion compensator 102.

The distortion compensator 102 performs the pre-distortion process to the transmission signal at a sampling rate R2 higher than a sampling rate R1 of the D/A converter 105 described below. Specifically, the distortion compensator 102 accepts an input of the transmission signal from the transmission signal generator 101. The transmission signal input into the distortion compensator 102 is appropriately hereinafter referred to as an "input signal". The distortion compensator 102 accepts an input of a distortion compensation coefficient from the coefficient generator 115. The distortion compensator 102 samples the input signal at the sampling rate R2 and multiplies the sampled input signal by the distortion compensation coefficient to generate the input signal subjected to the pre-distortion process (hereinafter referred to as a "pre-distortion signal"). The distortion components having the inverse characteristic of the non-linear distortion of the power amplifier 108 appear in the pre-distortion signal. The sampling rate R2 used by the distortion compensator 102 is selected, for example, so that the frequency band (hereinafter referred to as the "distortion compensation bandwidth") corresponding to the sampling rate R2 accommodates the distortion components appearing in the pre-distortion signal. The distortion compensator 102 supplies the generated pre-distortion signal to the LPF 103 and the subtractor 114.

Figure 2:
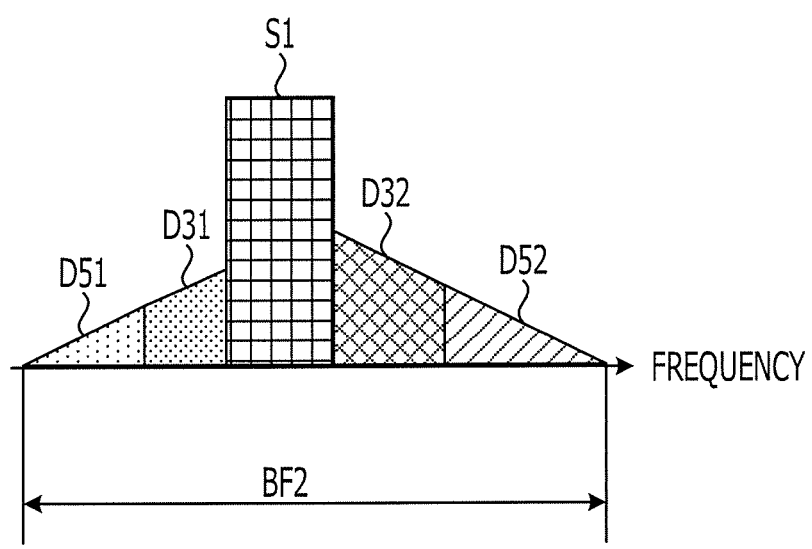
FIG. 2 illustrates an exemplary waveform of a pre-distortion signal output from a distortion compensator in the first embodiment.

FIG. 2 illustrates an exemplary waveform of the pre-distortion signal output from the distortion compensator in the first embodiment. The horizontal axis represents frequency and the vertical axis represents power in FIG. 2. As illustrated in FIG. 2, the pre-distortion signal output from the distortion compensator 102 includes distortion components D31 and D32 including cubic distortion components and quintic distortion components of a transmission signal S1 and quintic distortion components D51 and D52 of the transmission signal S1 as the distortion components. If the quintic distortion components D51 and D52, which are the high-frequency distortion components among the distortion components appearing in the pre-distortion signal, are not accommodated in a distortion compensation bandwidth BF2, the quintic distortion components D51 and D52 that are not accommodated in the distortion compensation bandwidth BF2 appear as the aliasing distortion. Accordingly, the distortion compensator 102 generates the pre-distortion signal at the sampling rate R2 higher than the sampling rate of the D/A converter 105, preferably, at the sampling rate R2 selected so that the distortion compensation bandwidth BF2 accommodates the quintic distortion components D51 and D52. Although the example in which the sampling rate is selected so that the distortion compensation bandwidth BF2 accommodates the quintic distortion components D51 and D52 is illustrated in FIG. 2, the sampling rate R2 may be selected so that the distortion compensation bandwidth BF2 accommodates distortion components higher than the quintic distortion components.

The LPF 103 accepts an input of the pre-distortion from the distortion compensator 102. The LPF 103 removes the frequency components exceeding the frequency band corresponding to the sampling rate R1 of the D/A converter 105 from the pre-distortion signal to supply the pre-distortion signal from which the frequency components are removed to the sampling rate converter 104.

Figure 3:
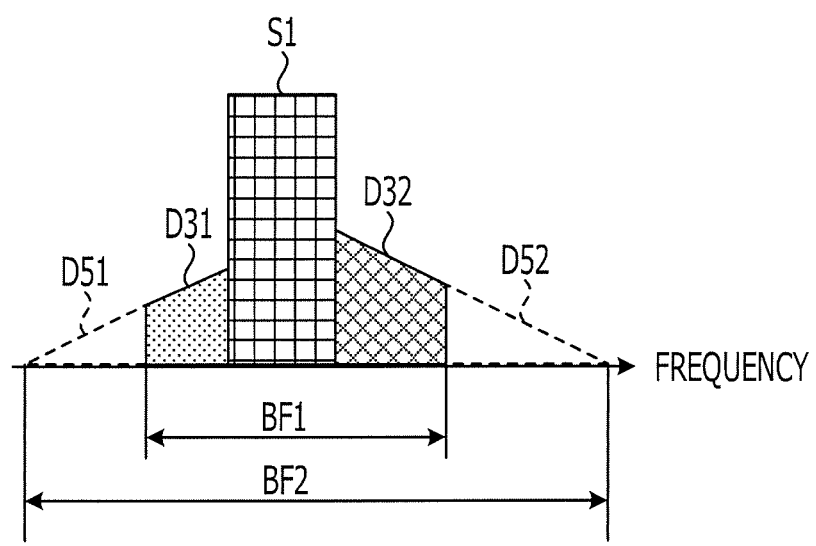
FIG. 3 illustrates an exemplary waveform of the pre-distortion signal output from an LPF in the first embodiment.

FIG. 3 illustrates an exemplary waveform of the pre-distortion signal output from the LPF in the first embodiment. The horizontal axis represents frequency and the vertical axis represents power in FIG. 3. As illustrated in FIG. 3, the LPF 103 removes the quintic distortion components D51 and D52, which are the frequency components exceeding a frequency band BF1 corresponding to the sampling rate R1 of the D/A converter 105, from the pre-distortion signal illustrated in FIG. 2. In other words, the LPF 103 transmits only the transmission signal S1 existing within the frequency band BF1 corresponding to the sampling rate R1 of the D/A converter 105 and the distortion components D31 and D32 of the transmission signal S1, in the pre-distortion signal illustrated in FIG. 2.

The sampling rate converter 104 accepts an input of the pre-distortion signal from which the frequency components are removed from the LPF 103. The sampling rate converter 104 converts the sampling rate of the pre-distortion signal from which the frequency components are removed from the sampling rate R2 of the distortion compensator 102 to the sampling rate R1 of the D/A converter 105. Specifically, the sampling rate converter 104 decimates the pre-distortion signal to convert the sampling rate of the pre-distortion signal from the sampling rate R2 of the distortion compensator 102 to the sampling rate R1 of the D/A converter 105. The decimation of the pre-distortion signal includes interpolation of the pre-distortion signal to decimate the pre-distortion signal subjected to the interpolation. The sampling rate converter 104 supplies the pre-distortion signal the sampling rate of which is converted to the D/A converter 105.

Figure 4:
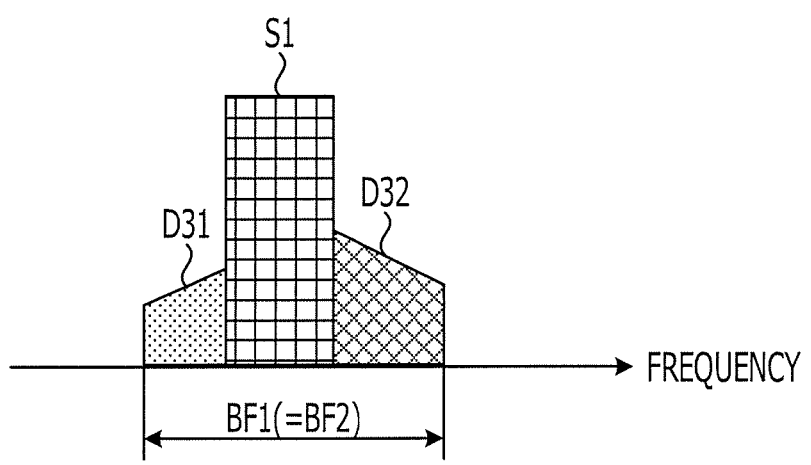
FIG. 4 illustrates an exemplary waveform of the pre-distortion signal output from a sampling rate converter in the first embodiment.

FIG. 4 illustrates an exemplary waveform of the pre-distortion signal output from the sampling rate converter in the first embodiment. The horizontal axis represents frequency and the vertical axis represents power in FIG. 4. The sampling rate converter 104 converts the sampling rate of the pre-distortion signal illustrated in FIG. 3 from the sampling rate R2 of the distortion compensator 102 to the sampling rate R1 of the D/A converter 105. As a result, the frequency band from a minimum frequency where the pre-distortion signal exists to a maximum frequency where the pre-distortion signal exists is adjusted from the distortion compensation bandwidth BF2 to the frequency band BF1 corresponding to the sampling rate R1 of the D/A converter 105, as illustrated in FIG. 4.

The D/A converter 105 accepts an input of the pre-distortion signal the sampling rate of which is converted from the sampling rate converter 104. The D/A converter 105 converts the pre-distortion signal into an analog signal at the sampling rate R1 to supply the pre-distortion signal, which is converted into the analog signal, to the QMOD 106.

The QMOD 106 accepts an input of the pre-distortion signal, which is converted into the analog signal, from the D/A converter 105. The QMOD 106 up-converts the pre-distortion signal to a radio frequency by using a signal supplied from the oscillator 107 to supply the up-converted pre-distortion signal to the power amplifier 108.

The power amplifier 108 accepts an input of the pre-distortion signal from the QMOD 106. The power amplifier 108 amplifies the pre-distortion signal to generate an output signal. The output signal output from the power amplifier 108 is branched into two. One of the two output signals resulting from the branching is transmitted to an external reception apparatus via the BPF 108a and the antenna 109 and the other thereof is supplied to the QDEM 110.

Figure 5:
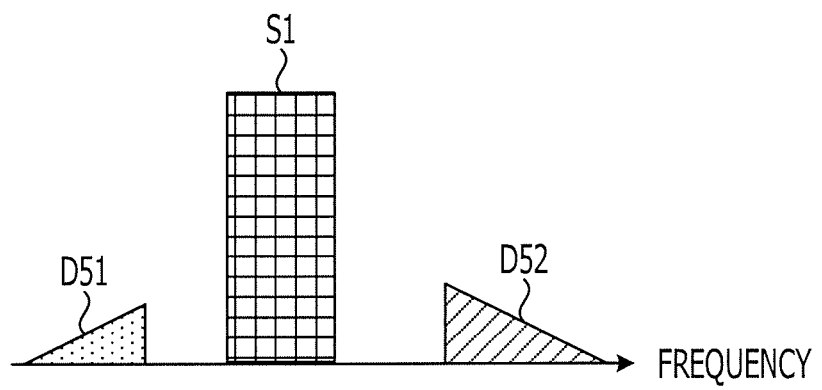
FIG. 5 illustrates an exemplary waveform of an output signal output from a power amplifier in the first embodiment.

FIG. 5 illustrates an exemplary waveform of the output signal output from the power amplifier in the first embodiment. The horizontal axis represents frequency and the vertical axis represents power in FIG. 5. The pre-distortion signal input into the power amplifier 108 includes the distortion components D31 and D32 of the transmission signal S1 illustrated in FIG. 4 as the distortion components having the inverse characteristic of the non-linear distortion of the power amplifier 108 and does not include the aliasing distortion. The distortion components D31 and D32 are offset by the non-linear distortion of the power amplifier 108. Accordingly, the output signal output from the power amplifier 108 includes the transmission signal S1 and the quintic distortion components D51 and D52, as illustrated in FIG. 5. In other words, no aliasing distortion remains in the output signal output from the power amplifier 108.

The BPF 108a has the frequency band BF1 corresponding to the sampling rate R1 of the D/A converter 105 as a transmission bandwidth. The BPF 108a removes the frequency components exceeding the frequency band BF1 corresponding to the sampling rate R1 of the D/A converter 105 from the output signal output from the power amplifier 108 to supply the output signal from which the frequency components are removed to the antenna 109. For example, the BPF 108a removes the quintic distortion components D51 and D52, which are the frequency components exceeding the frequency band BF1 corresponding to the sampling rate R1 of the D/A converter 105, from the output signal illustrated in FIG. 5 to supply the output signal from which the quintic distortion components are removed to the antenna 109.

The QDEM 110 accepts an input of the output signal output from the power amplifier 108. The output signal supplied from the power amplifier 108 to the QDEM 110 is hereinafter referred to as a "feedback signal". The QDEM 110 down-coverts the feedback signal to the frequency of the baseband signal by using a signal supplied from the oscillator 111 to supply the down-converted feedback signal to the A/D converter 112.

The A/D converter 112 accepts an input of the feedback signal down-converted into the frequency of the baseband signal from the QDEM 110. The A/D converter 112 converts the feedback signal into a digital signal at the same sampling rate as that of the distortion compensator 102, that is, at the sampling rate R2 to supply the feedback signal converted into the digital signal to the distortion compensator 113.

The distortion compensator 113 performs the pre-distortion process to the feedback signal at the sampling rate R2 higher than the sampling rate R1 of the D/A converter 105, as in the distortion compensator 102. Specifically, the distortion compensator 113 accepts an input of the feedback signal converted into the digital signal from the A/D converter 112. The distortion compensator 113 accepts an input of the distortion compensation coefficient from the coefficient generator 115. The distortion compensator 113 samples the feedback signal at the sampling rate R2 and multiples the sampled feedback signal by the distortion compensation coefficient to generate a feedback signal subjected to the pre-distortion process. The feedback signal subjected to the pre-distortion process is hereinafter referred to as a "feedback (FB) pre-distortion signal". The distortion compensator 113 supplies the generated FB pre-distortion signal to the subtractor 114.

The subtractor 114 accepts an input of the pre-distortion signal from the distortion compensator 102. The subtractor 114 accepts an input of the FB pre-distortion signal from the distortion compensator 113. The subtractor 114 generates an error signal indicating the difference between the pre-distortion signal and the FB pre-distortion signal. The subtractor 114 supplies the generated error signal to the coefficient generator 115.

The coefficient generator 115 accepts an input of the error signal from the subtractor 114. The coefficient generator 115 generates the distortion compensation coefficient based on the error signal. For example, the coefficient generator 115 generates the distortion compensation coefficient by an adaptive signal process using, for example, a least mean square (LMS) algorithm so that the error signal is minimized. The coefficient generator 115 supplies the generated distortion compensation coefficient to the distortion compensator 102 and the distortion compensator 113. The distortion compensation coefficient used by the distortion compensator 102 and the distortion compensator 113 are updated in the above manner.

Figure 6:
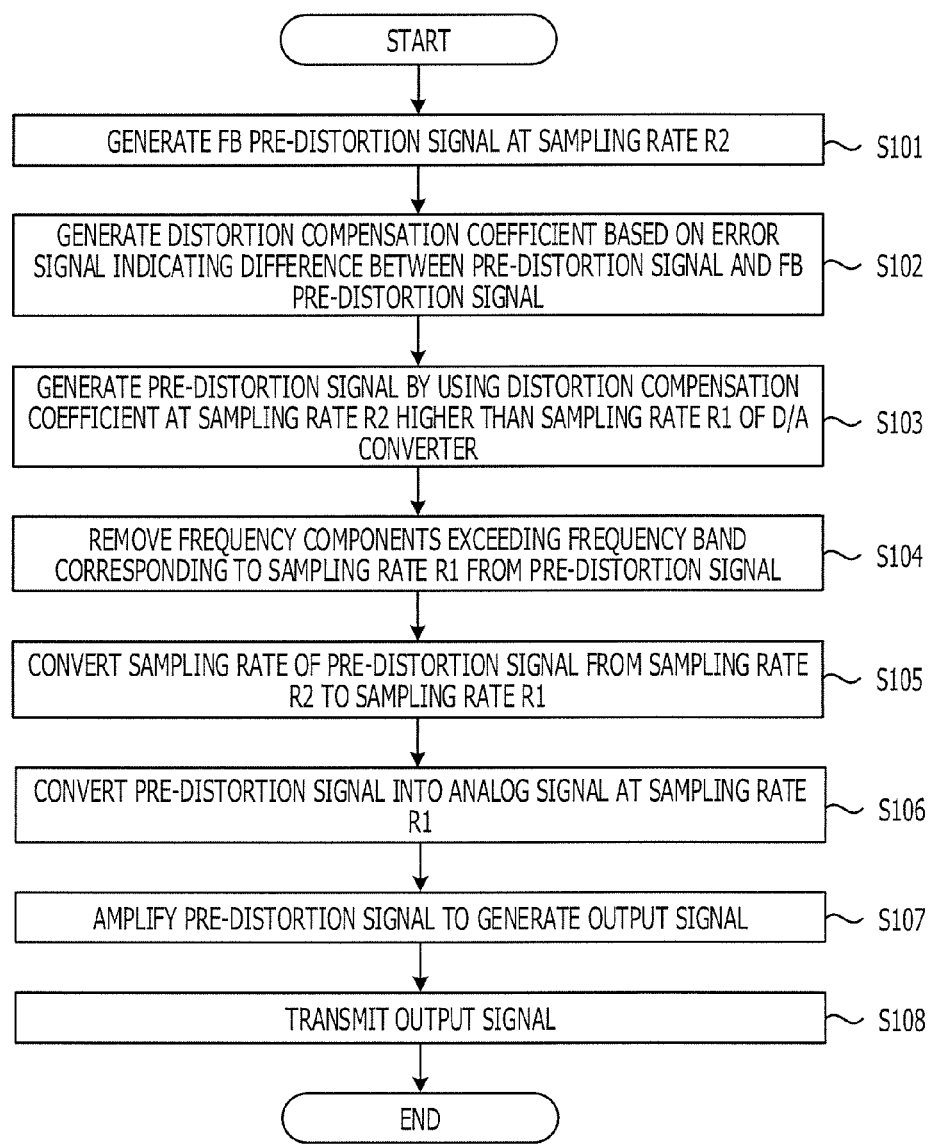
FIG. 6 is a flowchart illustrating an exemplary signal transmission process performed by the transmitter apparatus according to the first embodiment.

A signal transmission process performed by the transmitter apparatus 100 according to the first embodiment will now be described with reference to FIG. 6. FIG. 6 is a flowchart illustrating an example of the signal transmission process performed by the transmitter apparatus according to the first embodiment.

Referring to FIG. 6, in Step S101, the distortion compensator 113 generates the FB pre-distortion signal at the sampling rate R2 higher than the sampling rate R1 of the D/A converter 105. The distortion compensator 113 supplies the generated FB pre-distortion signal to the subtractor 114. The subtractor 114 generates the error signal indicating the difference between the pre-distortion signal supplied from the distortion compensator 102 and the FB pre-distortion signal supplied from the distortion compensator 113. The subtractor 114 supplies the generated error signal to the coefficient generator 115.

In Step S102, the coefficient generator 115 generates the distortion compensation coefficient based on the error signal supplied from the subtractor 114. The coefficient generator 115 supplies the distortion compensation coefficient to the distortion compensator 102 and the distortion compensator 113.

In Step S103, the distortion compensator 102 samples the input signal at the sampling rate R2 higher than the sampling rate R1 of the D/A converter 105 and multiplies the sampled input signal by the distortion compensation coefficient to generate the pre-distortion signal. The distortion compensator 102 supplies the generated pre-distortion signal to the LPF 103 and the subtractor 114.

In Step S104, the LPF 103 removes the frequency components exceeding the frequency band corresponding to the sampling rate R1 of the D/A converter 105 from the pre-distortion signal supplied from the distortion compensator 102. The LPF 103 supplies the pre-distortion signal from which the frequency components exceeding the frequency band corresponding to the sampling rate R1 of the D/A converter 105 are removed to the sampling rate converter 104.

In Step S105, the sampling rate converter 104 converts the sampling rate of the pre-distortion signal supplied from the LPF 103 from the sampling rate R2 of the distortion compensator 102 to the sampling rate R1 of the D/A converter 105.

The sampling rate converter 104 supplies the pre-distortion signal the sampling rate of which is converted to the D/A converter 105.

In Step S106, the D/A converter 105 converts the pre-distortion signal supplied from the sampling rate converter 104 into the analog signal at the sampling rate R1. The D/A converter 105 outputs the pre-distortion signal converted into the analog signal.

The pre-distortion signal is up-converted by the QMOD 106 and the oscillator 107 and is supplied to the power amplifier 108. In Step S107, the power amplifier 108 amplifies the supplied pre-distortion signal to generate the output signal.

In Step S108, the power amplifier 108 transmits the generated output signal to an external apparatus via the BPF 108a and the antenna 109.

As described above, the transmitter apparatus 100 according to the first embodiment generates the pre-distortion signal at the sampling rate R2 higher than the sampling rate R1 of the D/A converter 105. The transmitter apparatus 100 removes the frequency components exceeding the frequency band corresponding to the sampling rate R1 from the generated pre-distortion signal and converts the sampling rate of the pre-distortion signal from which the frequency components are removed into the sampling rate R1. The transmitter apparatus 100 converts the pre-distortion signal into the analog signal at the sampling rate R1 with the D/A converter 105 and supplies the pre-distortion signal the sampling rate of which is converted to the power amplifier 108. Accordingly, it is possible to avoid occurrence of the aliasing distortion in the output signal output from the power amplifier 108 even when the sampling rate R1 of the D/A converter 105 is relatively low. As a result, it is possible to suppress the degradation of the distortion compensation performance even when the sampling rate R1 of the D/A converter 105 is relatively low.

Second Embodiment

The example in which the feedback signal is converted into the digital signal at the sampling rate R2 of the distortion compensator 102 with the A/D converter 112 and the distortion compensation coefficient is generated based on the error signal indicating the difference between the FB pre-distortion signal and the pre-distortion signal is described in the first embodiment. However, the feedback signal may be converted into the digital signal at a sampling rate R3 lower than the sampling rate R2 and the distortion compensation coefficient may be generated based on the error signal indicating the difference between the FB pre-distortion signal and the pre-distortion signal. In a second embodiment, an example in which the feedback signal is converted into the digital signal at the sampling rate R3 lower than the sampling rate R2 and the distortion compensation coefficient is generated based on the error signal indicating the difference between the FB pre-distortion signal and the pre-distortion signal will be described.

Figure 7:
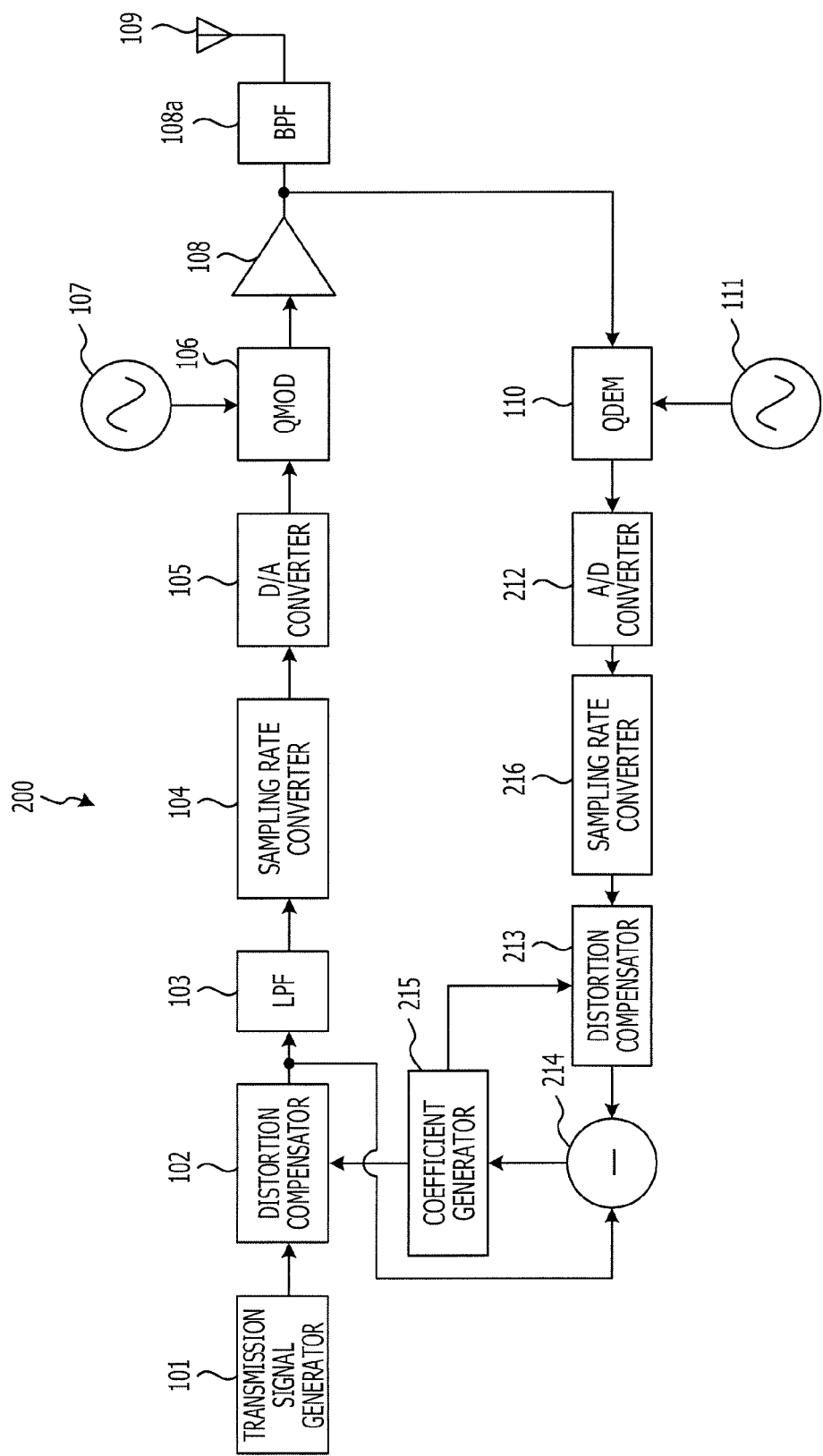
FIG. 7 illustrates an exemplary configuration of a transmitter apparatus according to a second embodiment.

FIG. 7 illustrates an exemplary configuration of a transmitter apparatus according to the second embodiment. The same reference numerals are used in FIG. 7 to identify the same components illustrated in FIG. 1. A description of such components is omitted herein. Referring to FIG. 7, a transmitter apparatus 200 according to the second embodiment includes an A/D converter 212, a distortion compensator 213, a subtractor 214, and a coefficient generator 215, instead of the A/D converter 112, the distortion compensator 113, the subtractor 114, and the coefficient generator 115, respectively, illustrated in FIG. 1. The transmitter apparatus 200 additionally includes a sampling rate converter 216 between the A/D converter 212 and the distortion compensator 213.

The A/D converter 212 accepts an input of the feedback signal down-converted into the frequency of the baseband signal from the QDEM 110. It is assumed that the A/D converter 212 converts the feedback signal into the digital signal at the same sampling rate as the sampling rate R2 of the distortion compensator 102. In this case, the specifications of the sampling process applied to the A/D converter 212 become high as in the distortion compensator 213 and the cost to provide the A/D converter 212 is also increased. Accordingly, the A/D converter 212 in the second embodiment converts the feedback signal into the digital signal at the sampling rate R3 lower than the sampling rate R2 of the distortion compensator 102 and supplies the feedback signal converted into the digital signal to the sampling rate converter 216.

The sampling rate converter 216 accepts an input of the feedback signal converted into the digital signal from the A/D converter 212. The sampling rate converter 216 converts the sampling rate of the feedback signal converted into the digital signal from the sampling rate R3 of the A/D converter 212 to the sampling rate R2 of the distortion compensator 102. Specifically, the sampling rate converter 216 interpolates the feedback signal to convert the sampling rate of the feedback signal from the sampling rate R3 of the A/D converter 212 to the sampling rate R2 of the distortion compensator 102. The sampling rate converter 216 supplies the feedback signal the sampling rate of which is converted to the distortion compensator 213.

The distortion compensator 213 performs the pre-distortion process to the feedback signal at the sampling rate R2 higher than the sampling rate R1 of the D/A converter 105, as in the distortion compensator 102. Specifically, the distortion compensator 213 accepts an input of the feedback signal the sampling rate of which is converted into the sampling rate R2 from the sampling rate converter 216. The distortion compensator 213 accepts an input of the distortion compensation coefficient from the coefficient generator 215. The distortion compensator 213 samples the feedback signal at the sampling rate R2 and multiplies the sampled feedback signal by the distortion compensation coefficient to generate the FB pre-distortion signal. The distortion compensator 213 supplies the generated FB pre-distortion signal to the subtractor 214.

The subtractor 214 accepts an input of the pre-distortion signal from the distortion compensator 102. The subtractor 214 accepts an input of the FB pre-distortion signal from the distortion compensator 213. The subtractor 214 generates the error signal indicating the difference between the pre-distortion signal and the FB pre-distortion signal. The subtractor 214 supplies the generated error signal to the coefficient generator 215.

The coefficient generator 215 accepts an input of the error signal from the subtractor 214. The coefficient generator 215 generates the distortion compensation coefficient based on the error signal and supplies the generated distortion compensation coefficient to the distortion compensator 102 and the distortion compensator 213. The distortion compensation coefficient used by the distortion compensator 102 and the distortion compensator 213 is updated in the above manner.

The distortion compensator 102 performs the pre-distortion process to the input signal by using the distortion compensation coefficient supplied from the coefficient generator 215.

Figure 8:
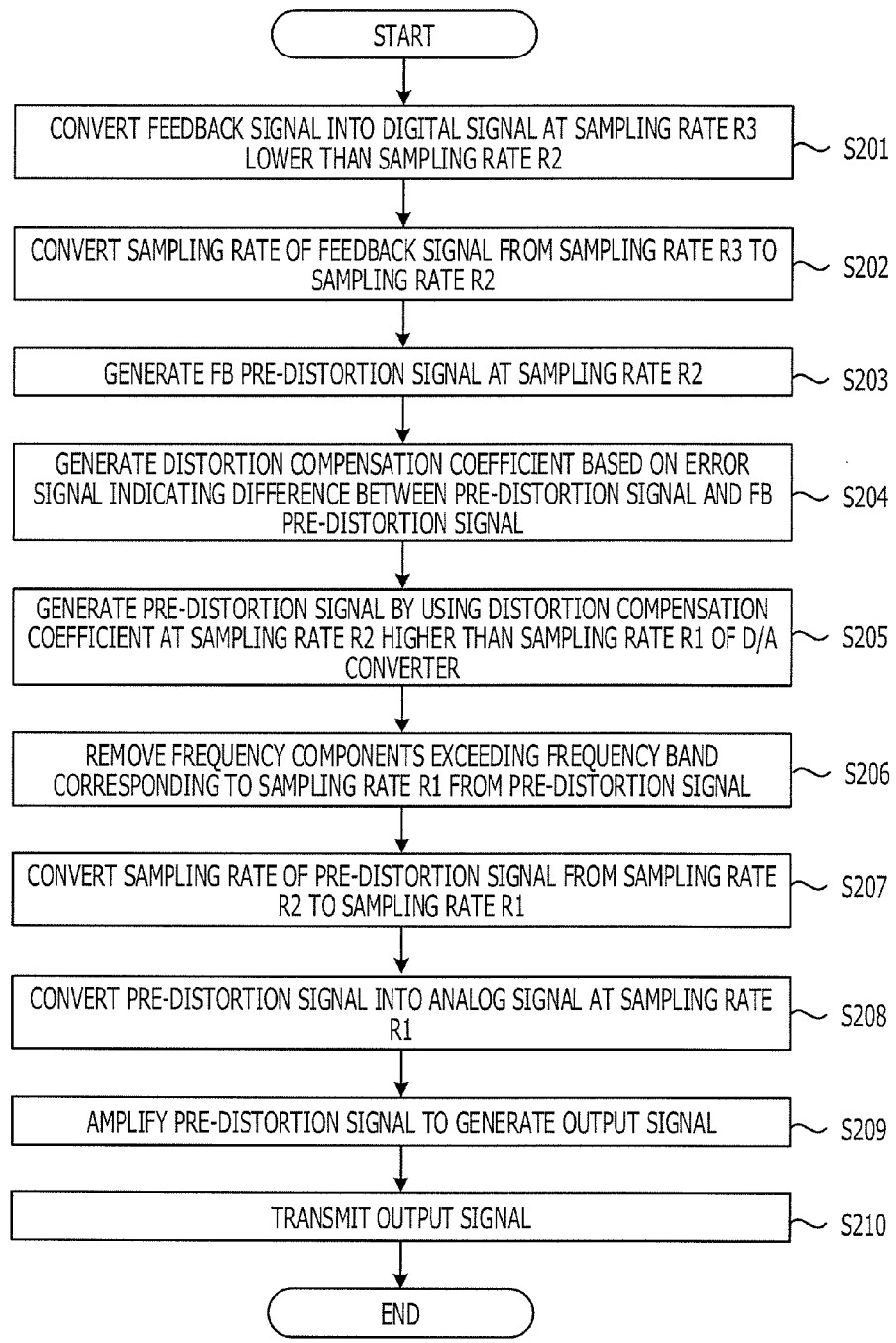
FIG. 8 is a flowchart illustrating an exemplary signal transmission process performed by the transmitter apparatus according to the second embodiment.

A signal transmission process performed by the transmitter apparatus 200 according to the second embodiment will now be described with reference to FIG. 8. FIG. 8 is a flowchart illustrating an example of the signal transmission process performed by the transmitter apparatus according to the second embodiment. Since Steps S205 to S210 illustrated in FIG. 8 are the same as Steps S103 to S108 illustrated in FIG. 6, a description of Steps S205 to S210 is omitted herein.

Referring to FIG. 8, in Step S201, the A/D converter 212 converts the feedback signal into the digital signal at the sampling rate R3 lower than the sampling rate R2 of the distortion compensator 102. The A/D converter 212 supplies the feedback signal converted into the digital signal to the sampling rate converter 216.

In Step S202, the sampling rate converter 216 converts the sampling rate of the feedback signal supplied from the A/D converter 212 from the sampling rate R3 of the A/D converter 212 to the sampling rate R2 of the distortion compensator 102. The sampling rate converter 216 supplies the feedback signal the sampling rate of which is converted to the distortion compensator 213.

In Step S203, the distortion compensator 213 samples the feedback signal at the sampling rate R2 and multiples the sampled feedback signal by the distortion compensation coefficient to generate the FB pre-distortion signal. The distortion compensator 213 supplies the generated FB pre-distortion signal to the subtractor 214. The subtractor 214 generates the error signal indicating the difference between the pre-distortion signal supplied from the distortion compensator 102 and the FB pre-distortion signal supplied from the distortion compensator 213 to supply the generated error signal to the coefficient generator 215.

In Step S204, the coefficient generator 215 generates the distortion compensation coefficient based on the error signal supplied from the subtractor 214. The coefficient generator 215 supplies the distortion compensation coefficient to the distortion compensator 102 and the distortion compensator 213.

As described above, the transmitter apparatus 200 according to the second embodiment converts the feedback signal into the digital signal at the sampling rate R3 lower than the sampling rate R2 of the distortion compensator 102. The transmitter apparatus 200 converts the sampling rate of the feedback signal converted into the digital signal into the sampling rate R2 of the distortion compensator 102. The transmitter apparatus 200 generates the distortion compensation coefficient based on the error signal calculated from the feedback signal the sampling rate of which is converted into the sampling rate R2 and the pre-distortion signal. Accordingly, it is possible to appropriately calculate the error signal and to appropriately update the distortion compensation coefficient even when the sampling rate R3 of the A/D converter 212 at which the feedback signal is converted into the digital signal is relatively low. As a result, it is possible to appropriately suppress the degradation of the distortion compensation performance even when the sampling rate R1 of the D/A converter 105 and the sampling rate R3 of the A/D converter 212 are relatively low.

Third Embodiment

The example in which the distortion compensation coefficient is generated based on the error signal indicating the difference between the pre-distortion signal supplied from the distortion compensator 102 and the FB pre-distortion signal supplied from the distortion compensator 213 is described in the second embodiment. However, the distortion compensation coefficient may be generated based on an error signal indicating the difference between the pre-distortion signal supplied from the LPF 103 and the FB pre-distortion signal supplied from the distortion compensator 213. In a third embodiment, an example in which the distortion compensation coefficient is generated based on the error signal indicating the difference between the pre-distortion signal supplied from the LPF 103 and the FB pre-distortion signal supplied from the distortion compensator 213 will be described.

Figure 9:
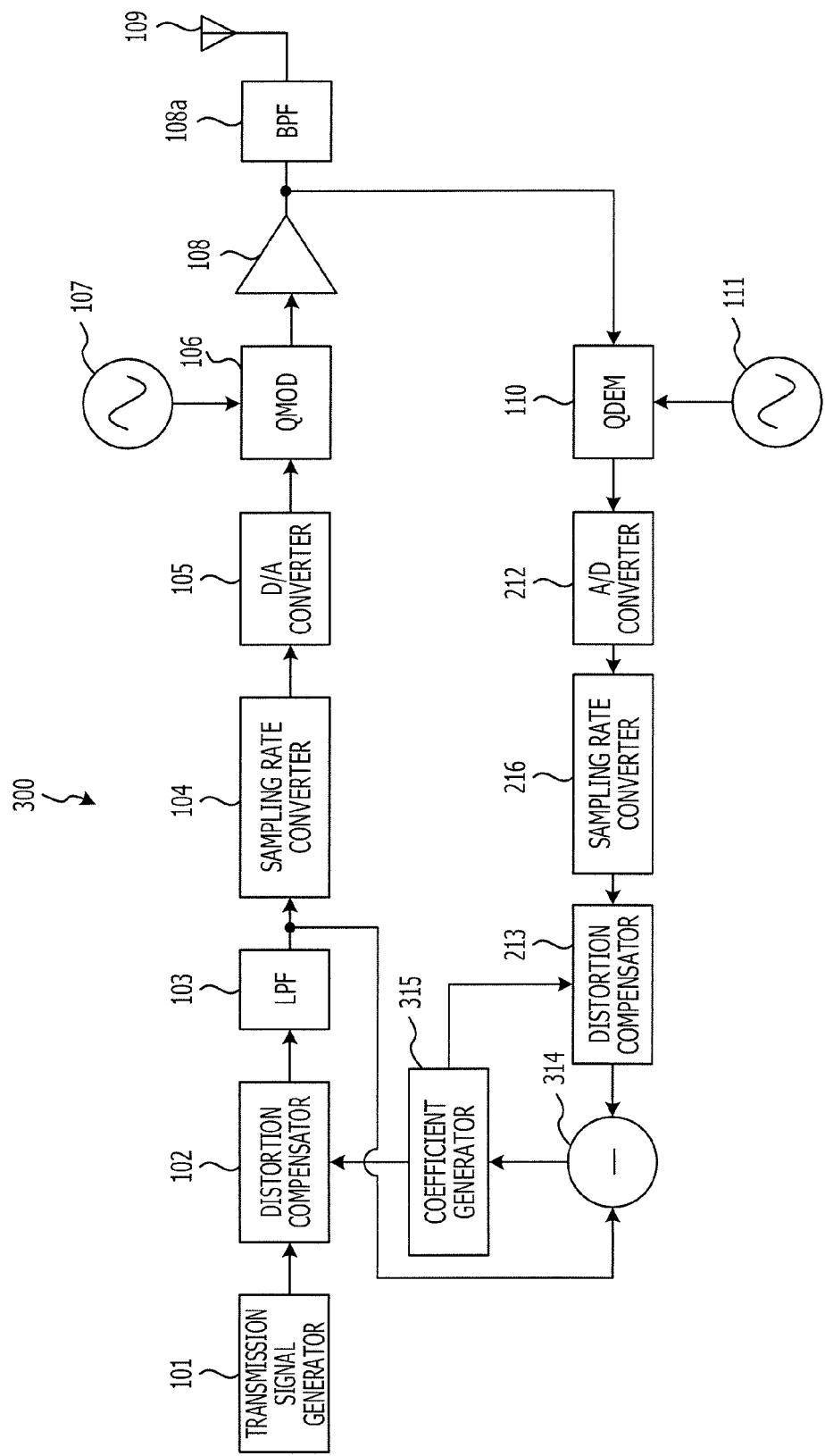
FIG. 9 illustrates an exemplary configuration of a transmitter apparatus according to a third embodiment.

FIG. 9 illustrates an exemplary configuration of a transmitter apparatus according to the third embodiment. The same reference numerals are used in FIG. 9 to identify the same components illustrated in FIG. 7. A description of such components is omitted herein. Referring to FIG. 9, a transmitter apparatus 300 according to the third embodiment includes a subtractor 314 and a coefficient generator 315, instead of the subtractor 214 and the coefficient generator 215, respectively, illustrated in FIG. 7.

The subtractor 314 accepts an input of the pre-distortion signal from which the frequency components exceeding the frequency band corresponding to the sampling rate R1 of the D/A converter 105 are removed from the LPF 103. The subtractor 314 accepts an input of the FB pre-distortion signal from the distortion compensator 213. The subtractor 314 generates the error signal indicating the difference between the pre-distortion signal from which the frequency components are removed and the FB pre-distortion signal. The subtractor 314 supplies the generated error signal to the coefficient generator 315.

The coefficient generator 315 accepts an input of the error signal indicating the difference between the pre-distortion signal from which the frequency components are removed and the FB pre-distortion signal from the subtractor 314. The coefficient generator 315 generates the distortion compensation coefficient based on the error signal to supply the generated distortion compensation coefficient to the distortion compensator 102 and the distortion compensator 213. The distortion compensation coefficient used by the distortion compensator 102 and the distortion compensator 213 is updated in the above manner.

The distortion compensator 102 performs the pre-distortion process to the input signal by using the distortion compensation coefficient supplied from the coefficient generator 315.

Figure 10:
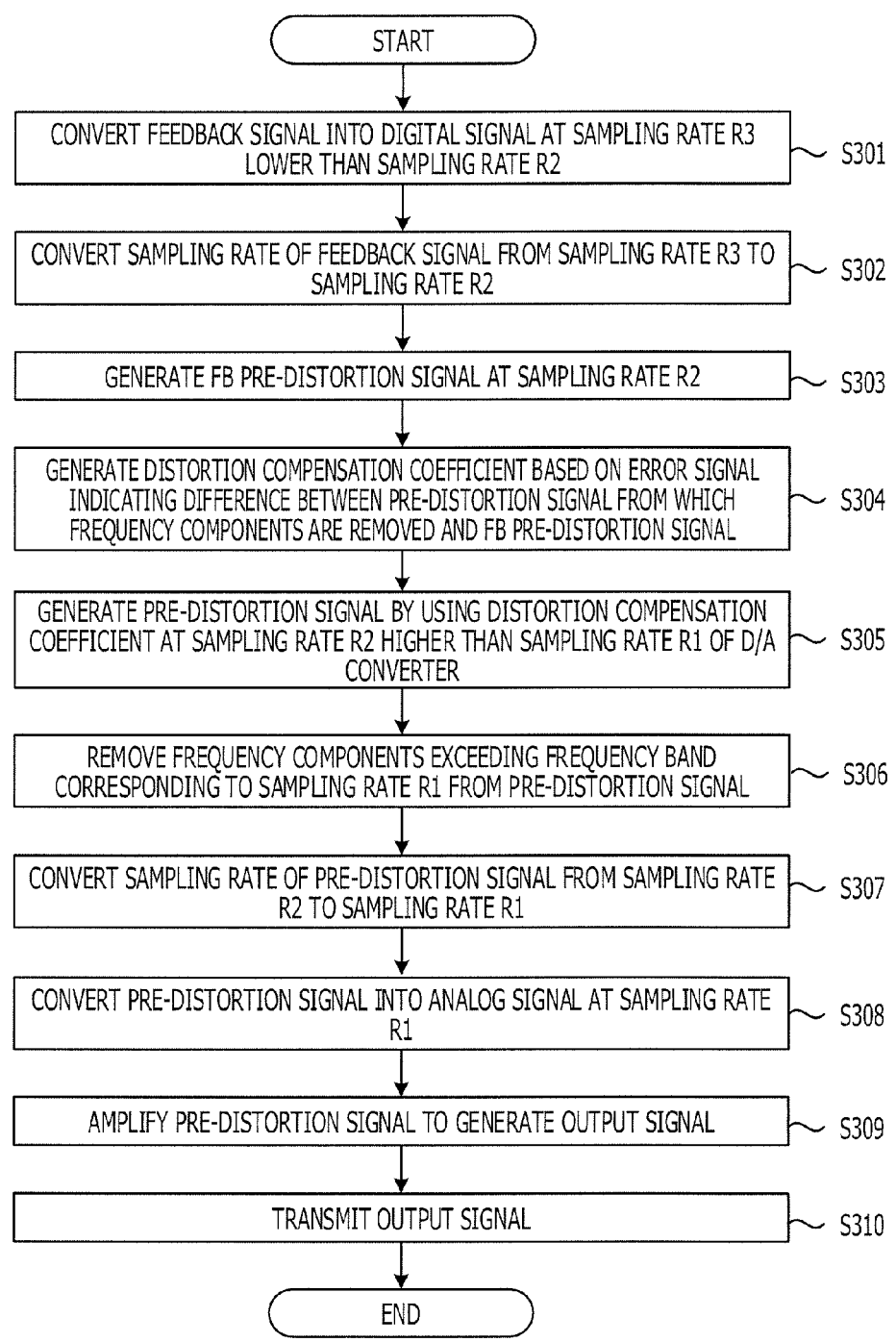
FIG. 10 is a flowchart illustrating an exemplary signal transmission process performed by the transmitter apparatus according to the third embodiment.

A signal transmission process performed by the transmitter apparatus 300 according to the third embodiment will now be described with reference to FIG. 10. FIG. 10 is a flowchart illustrating an example of the signal transmission process performed by the transmitter apparatus according to the third embodiment. Since Steps S301 to S303 and Steps S305 to S310 illustrated in FIG. 10 are the same as Steps S201 to S203 and Steps S205 to S210 illustrated in FIG. 8, a description of Steps S301 to S303 and Steps S305 to S310 is omitted herein.

The subtractor 314 generates the error signal indicating the difference between the pre-distortion signal supplied from the LPF 103 and the FB pre-distortion signal supplied from the distortion compensator 213 to supply the generated error signal to the coefficient generator 315.

In Step S304, the coefficient generator 315 generates the distortion compensation coefficient based on the error signal supplied from the subtractor 314, as illustrated in FIG. 10. The coefficient generator 315 supplies the distortion compensation coefficient to the distortion compensator 102 and the distortion compensator 213.

As described above, the transmitter apparatus 300 according to the third embodiment converts the feedback signal into the digital signal at the sampling rate R3 lower than the sampling rate R2 of the distortion compensator 102. The transmitter apparatus 300 converts the sampling rate of the feedback signal converted into the digital signal into the sampling rate R2 of the distortion compensator 102. The transmitter apparatus 300 generates the distortion compensation coefficient based on the error signal calculated from the feedback signal the sampling rate of which is converted into the sampling rate R2 and the pre-distortion signal from which the frequency components exceeding the frequency band corresponding to the sampling rate R1 of the D/A converter 105 are removed. Accordingly, it is possible to appropriately calculate the error signal and to appropriately update the distortion compensation coefficient even when the sampling rate R3 of the A/D converter 212 at which the feedback signal is converted into the digital signal is relatively low. As a result, it is possible to appropriately suppress the degradation of the distortion compensation performance even when the sampling rate R3 of the A/D converter 212 is relatively low.

Fourth Embodiment

The example in which the feedback signal is converted into the digital signal at the sampling rate R3 lower than the sampling rate R2 and the distortion compensation coefficient is generated based on the error signal indicating the difference between the FB pre-distortion signal and the pre-distortion signal is described in the second embodiment. However, the sampling rate of the pre-distortion signal may be converted into the sampling rate R3 and the distortion compensation coefficient may be generated based on the error signal indicating the difference between the FB pre-distortion signal and the pre-distortion signal. In a fourth embodiment, an example in which the sampling rate of the pre-distortion signal is converted into the sampling rate R3 and the distortion compensation coefficient is generated based on the error signal indicating the difference between the FB pre-distortion signal and the pre-distortion signal will be described.

Figure 11:
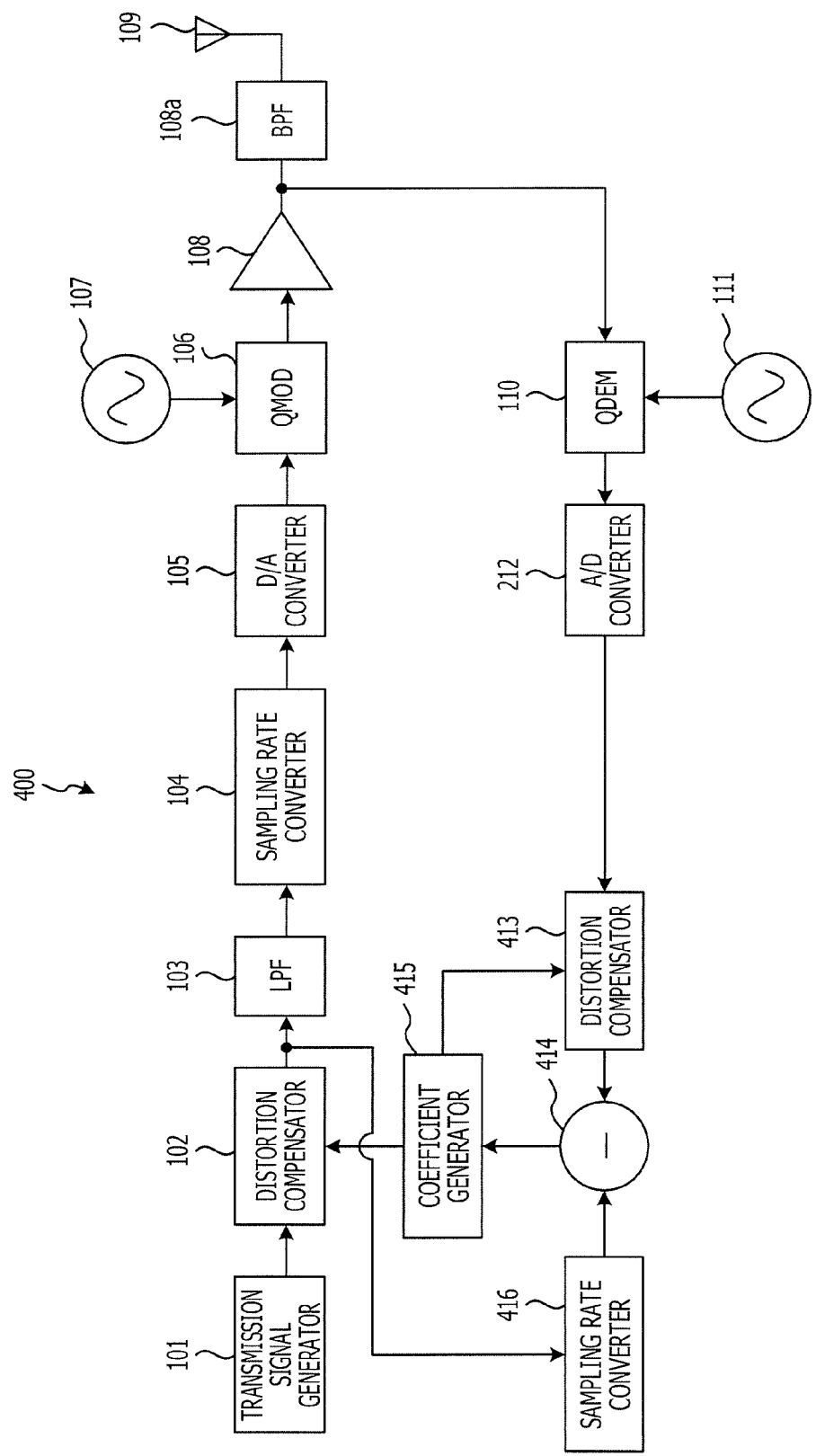
FIG. 11 illustrates an exemplary configuration of a transmitter apparatus according to a fourth embodiment.

FIG. 11 illustrates an exemplary configuration of a transmitter apparatus according to the fourth embodiment. The same reference numerals are used in FIG. 11 to identify the same components illustrated in FIG. 7. A description of such components is omitted herein. Referring to FIG. 11, a transmitter apparatus 400 according to the fourth embodiment includes a distortion compensator 413, a subtractor 414, and a coefficient generator 415, instead of the distortion compensator 213, the subtractor 214, and the coefficient generator 215, respectively, illustrated in FIG. 7. The transmitter apparatus 400 includes a sampling rate converter 416 between the distortion compensator 102 and the subtractor 414, instead of the sampling rate converter 216 illustrated in FIG. 7.

The distortion compensator 413 performs the pre-distortion process to the feedback signal at the sampling rate R3 of the A/D converter 212, which is lower than the sampling rate R2 of the distortion compensator 102. Specifically, the distortion compensator 413 accepts an input of the feedback signal converted into the digital signal at the sampling rate R3 from the A/D converter 212. The distortion compensator 413 accepts an input of the distortion compensation coefficient from the coefficient generator 415. The distortion compensator 413 samples the feedback signal at the sampling rate R3 and multiplies the sampled feedback signal by the distortion compensation coefficient to generate the FB pre-distortion signal. The distortion compensator 413 supplies the generated FB pre-distortion signal to the subtractor 414.

The sampling rate converter 416 accepts an input of the pre-distortion signal from the distortion compensator 102. The sampling rate converter 416 converts the sampling rate of the pre-distortion signal from the sampling rate R2 of the distortion compensator 102 into the sampling rate R3 lower than the sampling rate R2 of the distortion compensator 102. Specifically, the sampling rate converter 416 decimates the pre-distortion signal to convert the sampling rate of the pre-distortion signal into the sampling rate R3. The decimation of the pre-distortion signal includes the interpolation of the pre-distortion signal to decimate the pre-distortion signal subjected to the interpolation. The sampling rate converter 416 supplies the pre-distortion signal the sampling rate of which is converted to the subtractor 414.

The subtractor 414 accepts an input of the pre-distortion signal the sampling rate of which is converted into the sampling rate R3 from the sampling rate converter 416. The subtractor 414 accepts an input of the FB pre-distortion signal from the distortion compensator 413. The subtractor 414 generates the error signal indicating the difference between the pre-distortion signal and the FB pre-distortion signal. The subtractor 414 supplies the generated error signal to the coefficient generator 415.

The coefficient generator 415 accepts an input of the error signal from the subtractor 414. The coefficient generator 415 generates the distortion compensation coefficient based on the error signal and supplies the generated distortion compensation coefficient to the distortion compensator 102 and the distortion compensator 413. The distortion compensation coefficient used by the distortion compensator 102 and the distortion compensator 413 is updated in the above manner.

The distortion compensator 102 performs the pre-distortion process to the input signal by using the distortion compensation coefficient supplied from the coefficient generator 415.

Figure 12:
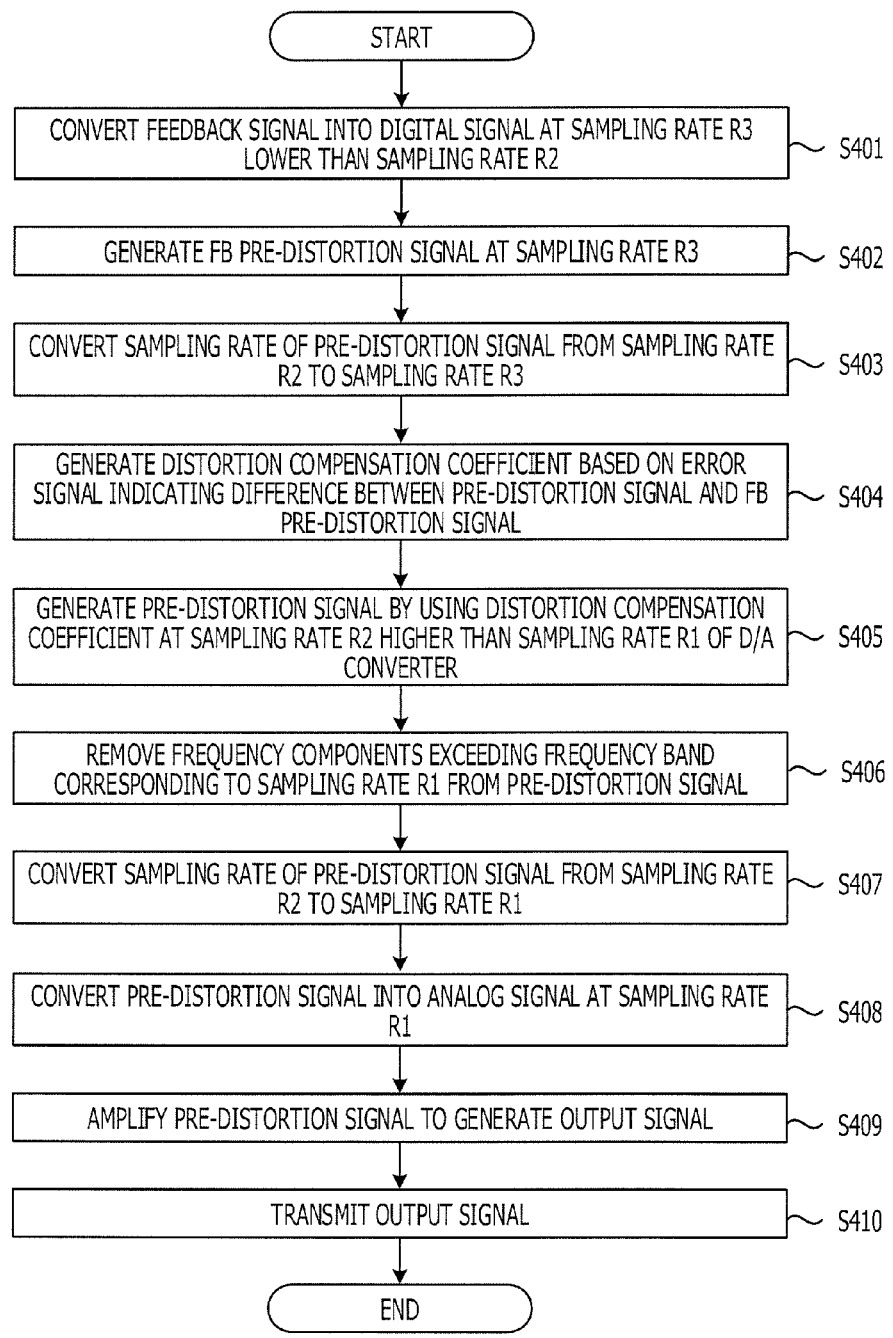
FIG. 12 is a flowchart illustrating an exemplary signal transmission process performed by the transmitter apparatus according to the fourth embodiment.

A signal transmission process performed by the transmitter apparatus 400 according to the fourth embodiment will now be described with reference to FIG. 12. FIG. 12 is a flowchart illustrating an example of the signal transmission process performed by the transmitter apparatus according to the fourth embodiment. Since Steps S405 to S410 illustrated in FIG. 12 are the same as Steps S205 to S210 illustrated in FIG. 8, a description of Steps S405 to S410 is omitted herein.

Referring to FIG. 12, in Step S401, the A/D converter 212 converts the feedback signal into the digital signal at the sampling rate R3 lower than the sampling rate R2 of the distortion compensator 102. The A/D converter 212 supplies the feedback signal converted into the digital signal to the distortion compensator 413.

In Step S402, the distortion compensator 413 samples the feedback signal at the sampling rate R3 and multiplies the sampled feedback signal by the distortion compensation coefficient to generate the FB pre-distortion signal. The distortion compensator 413 supplies the generated FB pre-distortion signal to the subtractor 414.

In Step S403, the sampling rate converter 416 converts the sampling rate of the pre-distortion signal supplied from the distortion compensator 102 from the sampling rate R2 of the distortion compensator 102 to the sampling rate R3 of the A/D converter 212. The sampling rate converter 416 supplies the pre-distortion signal the sampling rate of which is converted to the subtractor 414. The subtractor 414 generates the error signal indicating the difference between the pre-distortion signal supplied from the sampling rate converter 416 and the FB pre-distortion signal supplied from the distortion compensator 413 to supply the generated error signal to the coefficient generator 415.

In Step S404, the coefficient generator 415 generates the distortion compensation coefficient based on the error signal supplied from the subtractor 414. The coefficient generator 415 supplies the distortion compensation coefficient to the distortion compensator 102 and the distortion compensator 413.

As described above, the transmitter apparatus 400 according to the fourth embodiment converts the feedback signal into the digital signal at the sampling rate R3 lower than the sampling rate R2 of the distortion compensator 102. The transmitter apparatus 400 converts the sampling rate of the pre-distortion signal from the sampling rate R2 of the distortion compensator 102 to the sampling rate R3 of the A/D converter 212. The transmitter apparatus 400 generates the distortion compensation coefficient based on the error signal calculated from the pre-distortion signal the sampling rate of which is converted into the sampling rate R3 and the feedback signal converted into the digital signal at the sampling rate R3. Accordingly, it is possible to appropriately calculate the error signal and to appropriately update the distortion compensation coefficient even when the sampling rate R3 of the A/D converter 212 at which the feedback signal is converted into the digital signal is relatively low. As a result, it is possible to appropriately suppress the degradation of the distortion compensation performance even when the sampling rate R1 of the D/A converter 105 and the sampling rate R3 of the A/D converter 212 are relatively low.

Fifth Embodiment

The example in which the feedback signal is converted into the digital signal at the sampling rate R3 lower than the sampling rate R2 of the distortion compensator 102 and the distortion compensation coefficient is generated based on the error signal indicating the difference between the FB pre-distortion signal and the pre-distortion signal is described in the second embodiment. However, the feedback signal may be converted into the digital signal at the sampling rate R1 of the D/A converter 105 and the distortion compensation coefficient may be generated based on the error signal indicating the difference between the FB pre-distortion signal and the pre-distortion signal. In a fifth embodiment, an example in which the feedback signal is converted into the digital signal at the sampling rate R1 of the D/A converter 105 and the distortion compensation coefficient is generated based on the error signal indicating the difference between the FB pre-distortion signal and the pre-distortion signal will be described.

Figure 13:
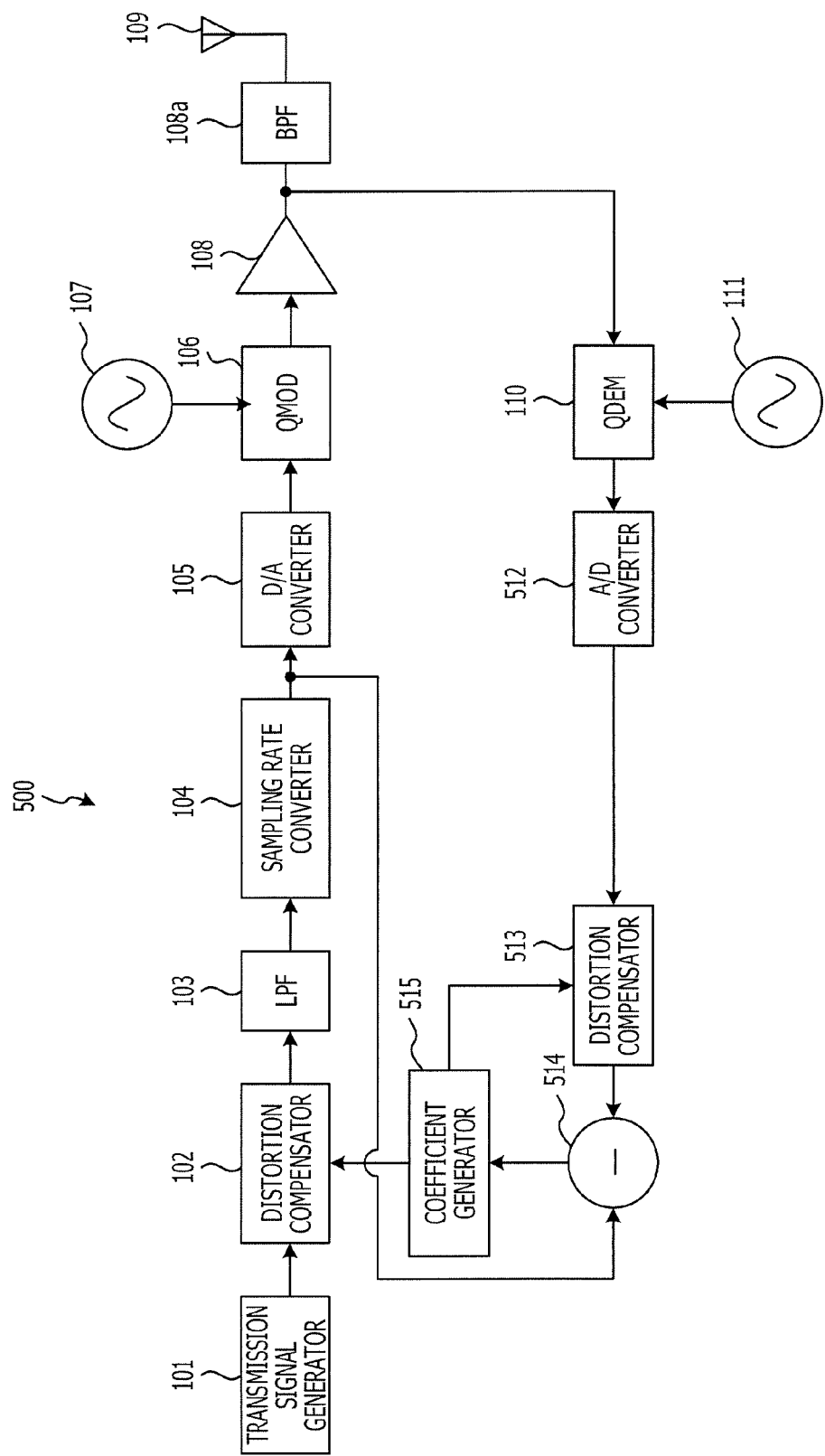
FIG. 13 illustrates an exemplary configuration of a transmitter apparatus according to a fifth embodiment.

FIG. 13 illustrates an exemplary configuration of a transmitter apparatus according to the fifth embodiment. The same reference numerals are used in FIG. 13 to identify the same components illustrated in FIG. 7. A description of such components is omitted herein. Referring to FIG. 13, a transmitter apparatus 500 according to the fifth embodiment includes an A/D converter 512, a distortion compensator 513, a subtractor 514, and a coefficient generator 515, instead of the A/D converter 212, the distortion compensator 213, the subtractor 214, and the coefficient generator 215, respectively, illustrated in FIG. 7. The transmitter apparatus 500 does not include the sampling rate converter 216 illustrated in FIG. 7.

The A/D converter 512 accepts an input of the feedback signal down-converted into the frequency of the baseband signal from the QDEM 110. The A/D converter 512 converts the feedback signal into the digital signal at the sampling rate R1 of the D/A converter 105 to supply the feedback signal converted into the digital signal to the distortion compensator 513.

The distortion compensator 513 performs the pre-distortion signal to the feedback signal at the sampling rate R1 of the D/A converter 105. Specifically, the distortion compensator 513 accepts an input of the feedback signal converted into the digital signal at the sampling rate R1 of the D/A converter 105 from the A/D converter 512. The distortion compensator 513 accepts an input of the distortion compensation coefficient from the coefficient generator 515. The distortion compensator 513 samples the feedback signal at the sampling rate R1 of the D/A converter 105 and multiplies the sampled feedback signal by the distortion compensation coefficient to generate the FB pre-distortion signal. The distortion compensator 513 supplies the generated FB pre-distortion signal to the subtractor 514.

The subtractor 514 accepts an input of the pre-distortion signal the sampling rate of which is converted into the sampling rate R1 of the D/A converter 105 from the sampling rate converter 104. The subtractor 514 accepts an input of the FB pre-distortion signal from the distortion compensator 513. The subtractor 514 generates the error signal indicating the difference between the pre-distortion signal and the FB pre-distortion signal. The subtractor 514 supplies the generated error signal to the coefficient generator 515.

The coefficient generator 515 accepts an input of the error signal from the subtractor 514. The coefficient generator 515 generates the distortion compensation coefficient based on the error signal to supply the generated distortion compensation coefficient to the distortion compensator 102 and the distortion compensator 513. The distortion compensation coefficient used by the distortion compensator 102 and the distortion compensator 513 is updated in the above manner.

The distortion compensator 102 performs the pre-distortion process to the input signal by using the distortion compensation coefficient supplied from the coefficient generator 515.

Figure 14:
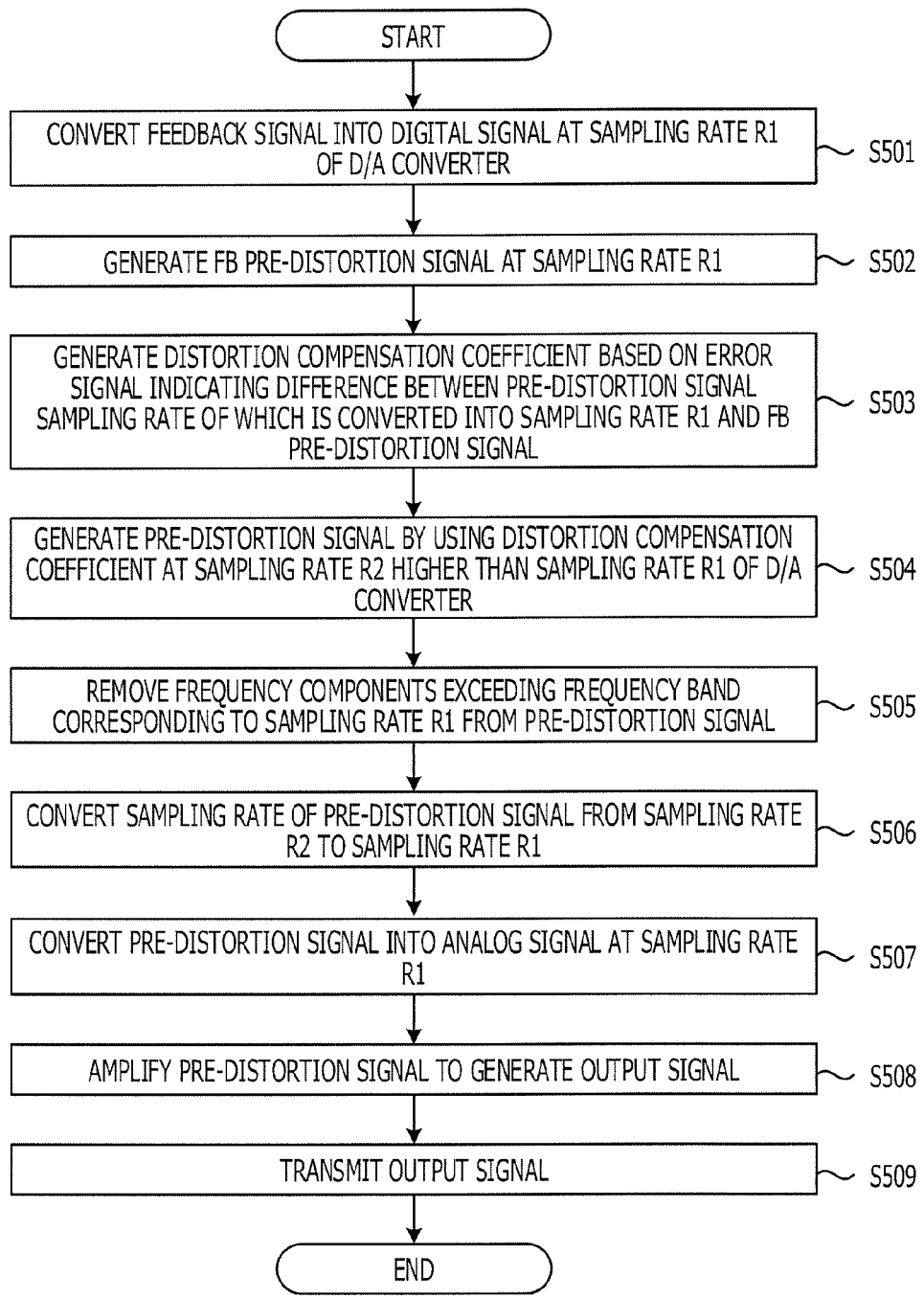
FIG. 14 is a flowchart illustrating an exemplary signal transmission process performed by the transmitter apparatus according to the fifth embodiment.

A signal transmission process performed by the transmitter apparatus 500 according to the fifth embodiment will now be described with reference to FIG. 14. FIG. 14 is a flowchart illustrating an example of the signal transmission process performed by the transmitter apparatus according to the fifth embodiment. Since Steps S504 to S509 illustrated in FIG. 14 are the same as Steps S205 to S210, respectively, illustrated in FIG. 8, a description of Steps S504 to S509 is omitted herein.

Referring to FIG. 14, in Step S501, the A/D converter 512 converts the feedback signal into the digital signal at the sampling rate R1 of the D/A converter 105. The A/D converter 512 supplies the feedback signal converted into the digital signal to the distortion compensator 513.

In Step S502, the distortion compensator 513 samples the feedback signal at the sampling rate R1 of the D/A converter 105 and multiplies the sampled feedback signal by the distortion compensation coefficient to generate the FB pre-distortion signal. The distortion compensator 513 supplies the generated FB pre-distortion signal to the subtractor 514. The subtractor 514 generates the error signal indicating the difference between the pre-distortion signal supplied from the sampling rate converter 104 and the FB pre-distortion signal supplied from the distortion compensator 513 to supply the generated error signal to the coefficient generator 515.

In Step S503, the coefficient generator 515 generates the distortion compensation coefficient based on the error signal supplied from the subtractor 514. The coefficient generator 515 supplies the distortion compensation coefficient to the distortion compensator 102 and the distortion compensator 513.

As described above, the transmitter apparatus 500 according to the fifth embodiment converts the feedback signal into the digital signal at the sampling rate R1 of the D/A converter 105. The transmitter apparatus 500 generates the distortion compensation coefficient based on the error signal calculated from the feedback signal converted into the digital signal at the sampling rate R1 of the D/A converter 105 and the pre-distortion signal the sampling rate of which is converted into the sampling rate R1. Accordingly, it is possible to appropriately calculate the error signal and to appropriately update the distortion compensation coefficient even when the sampling rate R1 of the D/A converter 105 at which the feedback signal is converted into the digital signal is relatively low. As a result, it is possible to appropriately suppress the degradation of the distortion compensation performance even when the sampling rate R1 of the D/A converter 105 is relatively low.

(First Modification)

The examples in which the distortion compensation coefficient is generated by using the error signal indicating the difference between the pre-distortion signal and the FB pre-distortion signal are described in the first to fifth embodiments described above. However, the distortion compensation coefficient may be generated by using an error signal indicating the difference between the transmission signal and the feedback signal. In first modifications of the first to fifth embodiments, an example in which the distortion compensation coefficient is generated by using the error signal indicating the difference between the transmission signal and the feedback signal will be described. The first modification of the transmitter apparatus 200 according to the second embodiment will be described as a representative of the first modifications of the first to fifth embodiments.

Figure 15:
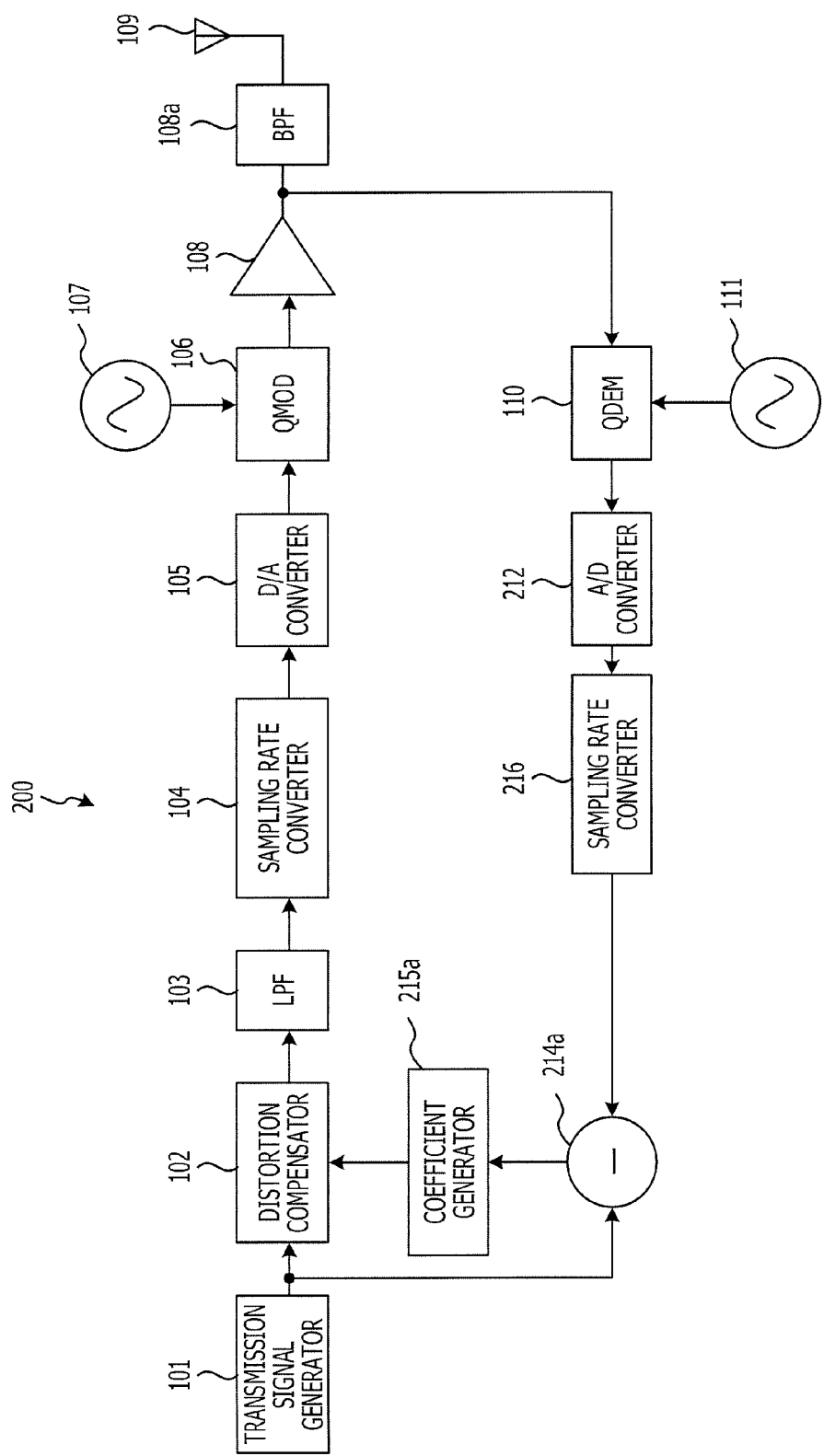
FIG. 15 illustrates an exemplary configuration of a transmitter apparatus according to a first modification of the second embodiment.

FIG. 15 illustrates an exemplary configuration of a transmitter apparatus according to the first modification of the second embodiment. The same reference numerals are used in FIG. 15 to identify the same components illustrated in FIG. 7. A description of such components is omitted herein. Referring to FIG. 15, the transmitter apparatus 200 according to the first modification of the second embodiment includes a subtractor 214a and a coefficient generator 215a, instead of the subtractor 214 and the coefficient generator 215, respectively, illustrated in FIG. 7. The transmitter apparatus 200 according to the first modification of the second embodiment does not include the distortion compensator 213 illustrated in FIG. 7.

The subtractor 214a accepts an input of the transmission signal from the transmission signal generator 101. The subtractor 214a accepts an input of the feedback signal from the sampling rate converter 216. The subtractor 214a generates the error signal indicating the difference between the transmission signal and the feedback signal. The subtractor 214a supplies the generated error signal to the coefficient generator 215a.

The coefficient generator 215a accepts an input of the error signal from the subtractor 214a. The coefficient generator 215a generates the distortion compensation coefficient based on the error signal to supply the generated distortion compensation coefficient to the distortion compensator 102. The distortion compensation coefficient used by the distortion compensator 102 is updated in the above manner.

As described above, the transmitter apparatus 200 according to the first modification generates the distortion compensation coefficient by using the error signal indicating the difference between the transmission signal and the feedback signal. Accordingly, it is possible to reduce, for example, the pre-distortion process to the feedback signal to reduce the processing load of the transmitter apparatus and the size of the processing circuit.

(Second Modification)

The example in which the BPF 108a is provided between the branch point at which the output signal output from the power amplifier 108 is branched into two and the antenna 109 is described in the first to fifth embodiments and the first modification. However, a BPF may be further provided between the branch point at which the output signal output from the power amplifier 108 is branched into two and the QDEM 110. In second modifications of the first to fifth embodiments, an example in which a BPF is further provided between the branch point at which the output signal output from the power amplifier 108 is branched into two and the QDEM 110 will be described. The second modification of the transmitter apparatus 100 according to the first embodiment will be described as a representative of the second modifications of the first to fifth embodiments.

Figure 16:
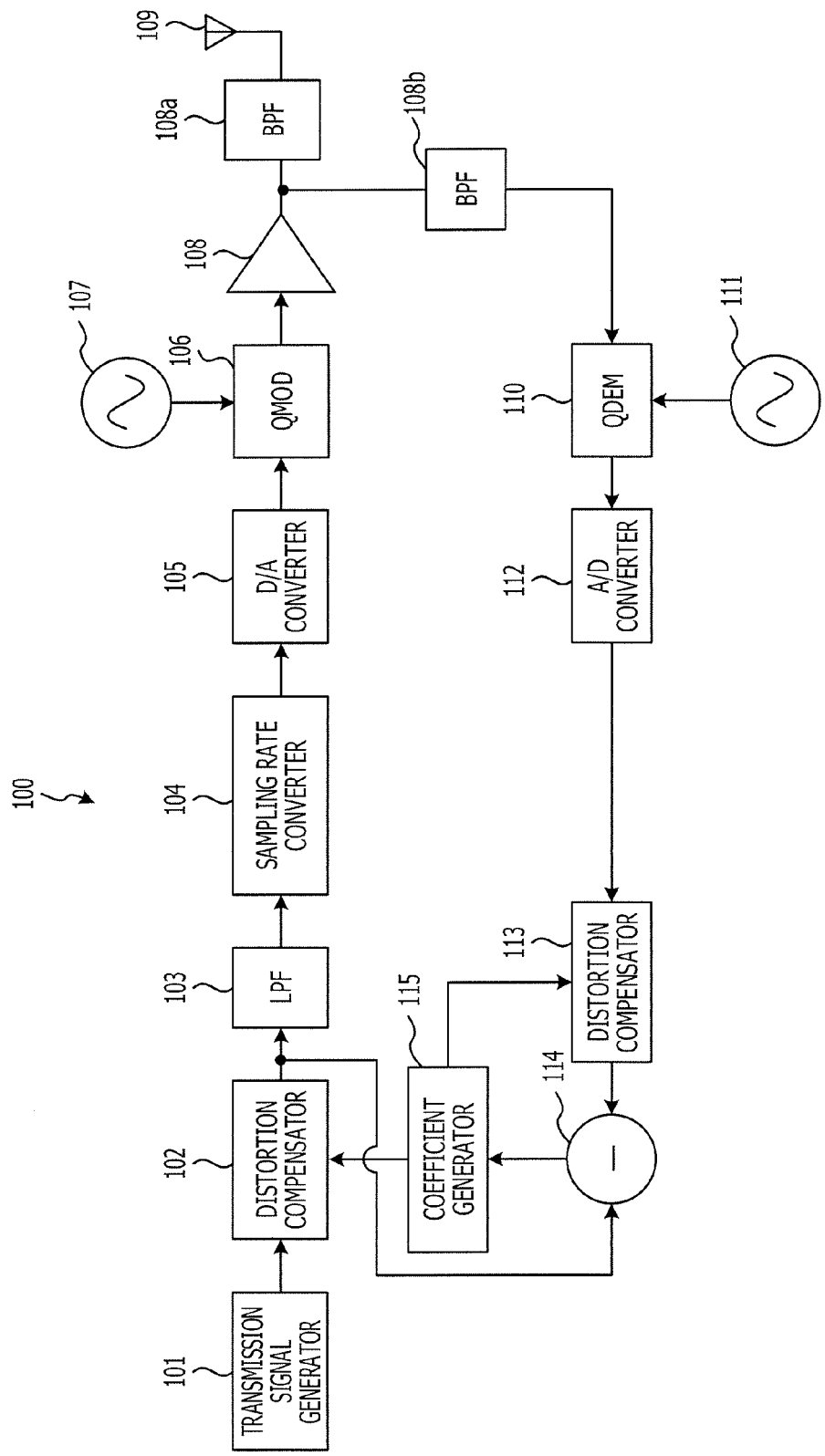
FIG. 16 illustrates an exemplary configuration of a transmitter apparatus according to a second modification of the first embodiment.

FIG. 16 illustrates an exemplary configuration of a transmitter apparatus according to the second modification of the first embodiment. The same reference numerals are used in FIG. 16 to identify the same components illustrated in FIG. 1. A description of such components is omitted herein. Referring to FIG. 16, the transmitter apparatus 100 according to the second modification of the first embodiment further includes a BPF 108b provided between the branch point at which the output signal output from the power amplifier 108 is branched into two and the QDEM 110.

The BPF 108b has the frequency band BF1 corresponding to the sampling rate R1 of the D/A converter 105 as the transmission bandwidth, as in the BPF 108a. The BPF 108b removes the frequency components exceeding the frequency band BF1 corresponding to the sampling rate R1 of the D/A converter 105 from the feedback signal output from the power amplifier 108 to supply the feedback signal from which the frequency components are removed to the QDEM 110. For example, the BPF 108b removes the quintic distortion components, which are the frequency components exceeding the frequency band BF1 corresponding to the sampling rate R1 of the D/A converter 105, from the feedback signal to supply the feedback signal from which the quintic distortion components are removed to the QDEM 110.

As described above, the transmitter apparatus 100 according to the second modification is capable of removing the excess distortion components from the feedback signal.

(Third Modification)

The example in which the BPF 108a is provided between the branch point at which the output signal output from the power amplifier 108 is branched into two and the antenna 109 is described in the first to fifth embodiments and the first modification. However, a BPF may be provided between the power amplifier 108 and the branch point at which the output signal output from the power amplifier 108 is branched into two. In third modifications of the first to fifth embodiments, an example in which a BPF is provided between the power amplifier 108 and the branch point at which the output signal output from the power amplifier 108 is branched into two will be described. The third modification of the transmitter apparatus 100 according to the first embodiment will be described as a representative of the third modifications of the first to fifth embodiments.

Figure 17:
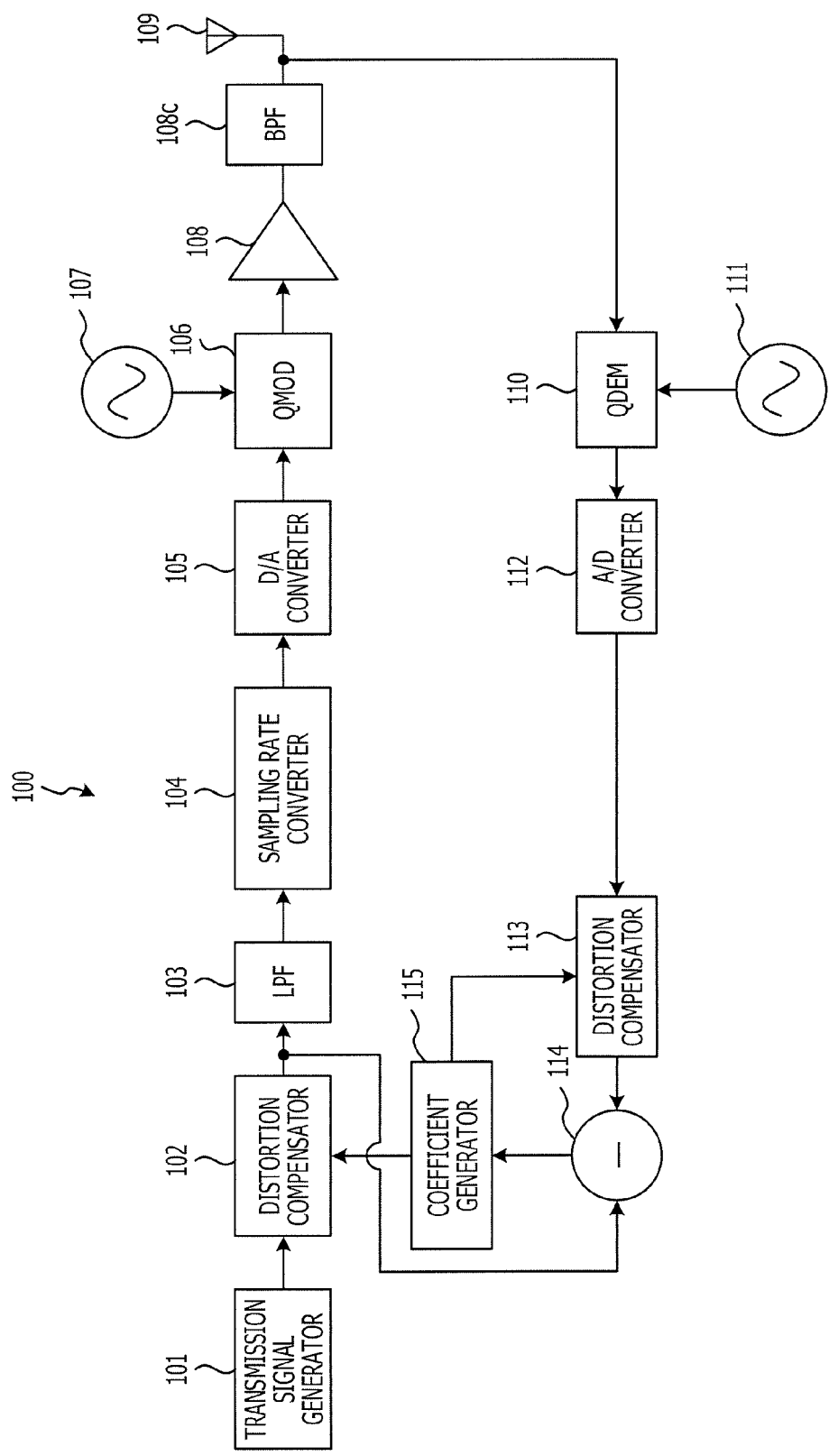
FIG. 17 illustrates an exemplary configuration of a transmitter apparatus according to a third modification of the first embodiment.
Figure 18:
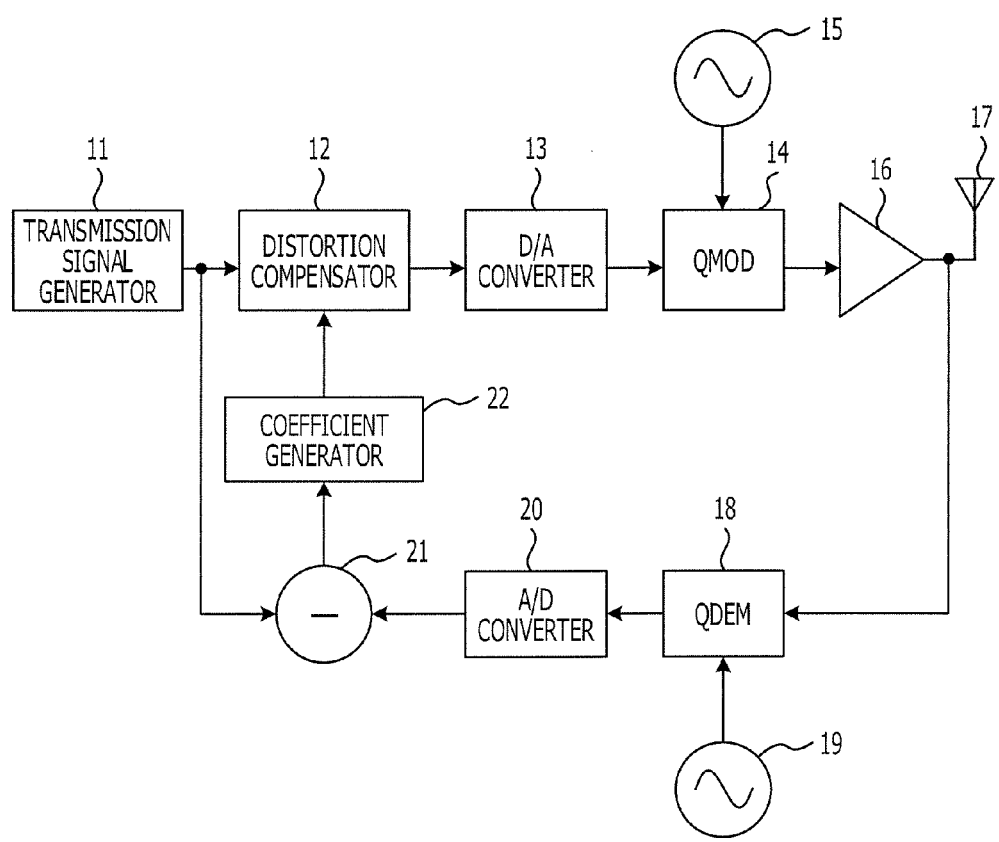
FIG. 18 illustrates an exemplary configuration of a power amplifier apparatus in related art adopting a PD method.

FIG. 17 illustrates an exemplary configuration of a transmitter apparatus according to the third modification of the first embodiment. The same reference numerals are used in FIG. 17 to identify the same components illustrated in FIG. 1. A description of such components is omitted herein. Referring to FIG. 17, the transmitter apparatus 100 according to the third modification of the first embodiment includes a BPF 108c provided between the power amplifier 108 and the branch point at which the output signal output from the power amplifier 108 is branched into two. The transmitter apparatus 100 according to the third modification of the first embodiment does not include the BPF 108a illustrated in FIG. 1.

The BPF 108c has the frequency band BF1 corresponding to the sampling rate R1 of the D/A converter 105 as the transmission bandwidth, as in the BPF 108a. The BPF 108c removes the frequency components exceeding the frequency band BF1 corresponding to the sampling rate R1 of the D/A converter 105 from the output signal output from the power amplifier 108 to generate the output signal from which the frequency components are removed. The output signal generated by the BPF 108c is branched into two at the branch point. One of the two output signals resulting from the branching is transmitted to an external reception apparatus via the antenna 109 and the other thereof is supplied to the QDEM 110 as the feedback signal.

As described above, the transmitter apparatus 100 according to the third modification is capable of removing the excess distortion components from both the output signal output from the power amplifier 108 and the feedback signal by using one BPF 108c.

Sixth Embodiment

The example in which the frequency components are removed from the pre-distortion signal by the LPF is described in the first to fifth embodiments described above. However, when the frequency components are simply removed from the pre-distortion signal, as in the first to fifth embodiments, the probability of an occurrence of a shift between the distortion characteristics of the pre-distortion signal and the distortion characteristics of the non-linear distortion of the power amplifier 108 is increased with the increasing amount of the frequency components that are removed. Upon occurrence of the shift between the distortion characteristics of the pre-distortion signal and the distortion characteristics of the non-linear distortion of the power amplifier 108, distortion other than the aliasing distortion (hereinafter referred to as "remaining distortion") remains in the output signal output from the power amplifier 108 to cause the degradation of the distortion compensation performance.

Figure 21:
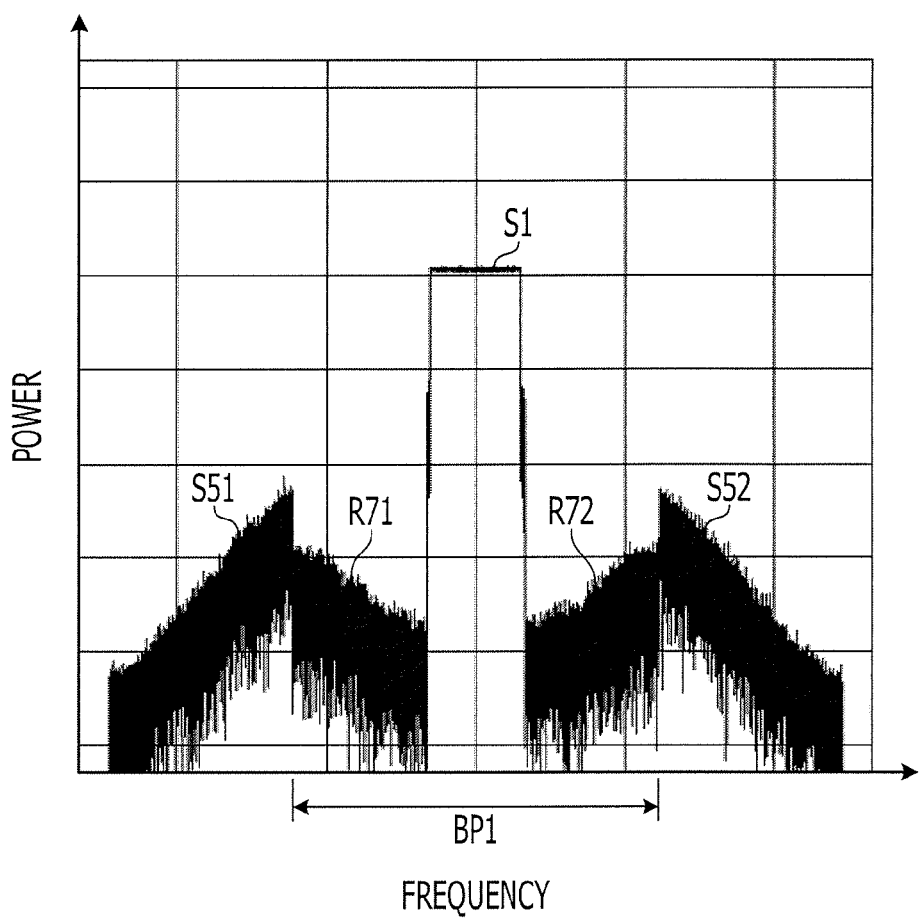
FIG. 21 illustrates an exemplary waveform of the output signal from the power amplifier when remaining distortion occurs.

FIG. 21 illustrates an exemplary waveform of the output signal from the power amplifier when the remaining distortion occurs. The horizontal axis represents frequency and the vertical axis represents power in FIG. 21. It is assumed in the example illustrated in FIG. 21 that, as the result of the removal of the frequency components exceeding the frequency band BF1 from the pre-distortion signal by the LPF, the distortion characteristics of the pre-distortion signal supplied to the power amplifier are shifted from the distortion characteristics of the non-linear distortion of the power amplifier. In such a case, distortion components R71 and R72 that increase from the edges of the frequency band of the transmission signal S1 to the edges of the frequency band BF1, which is the transmission bandwidth of the LPF, occur in the output signal output from the power amplifier as the remaining distortion, as illustrated in FIG. 21.

In order to suppress the remaining distortion, a signal corresponding to the remaining distortion may be generated in advance and the signal corresponding to the remaining distortion may be subtracted from the pre-distortion signal from which the frequency components are removed by the LPF to supply the pre-distortion signal resulting from the subtraction to the power amplifier. The signal corresponding to the remaining distortion is, for example, a signal including the distortion components R71 and R72 as the remaining distortion illustrated in FIG. 21. Accordingly, in a sixth embodiment, an example in which the signal corresponding to the remaining distortion is generated in advance and the signal corresponding to the remaining distortion is subtracted from the pre-distortion signal from which the frequency components are removed by the LPF to supply the pre-distortion signal resulting from the subtraction to the power amplifier will be described.

Figure 22:
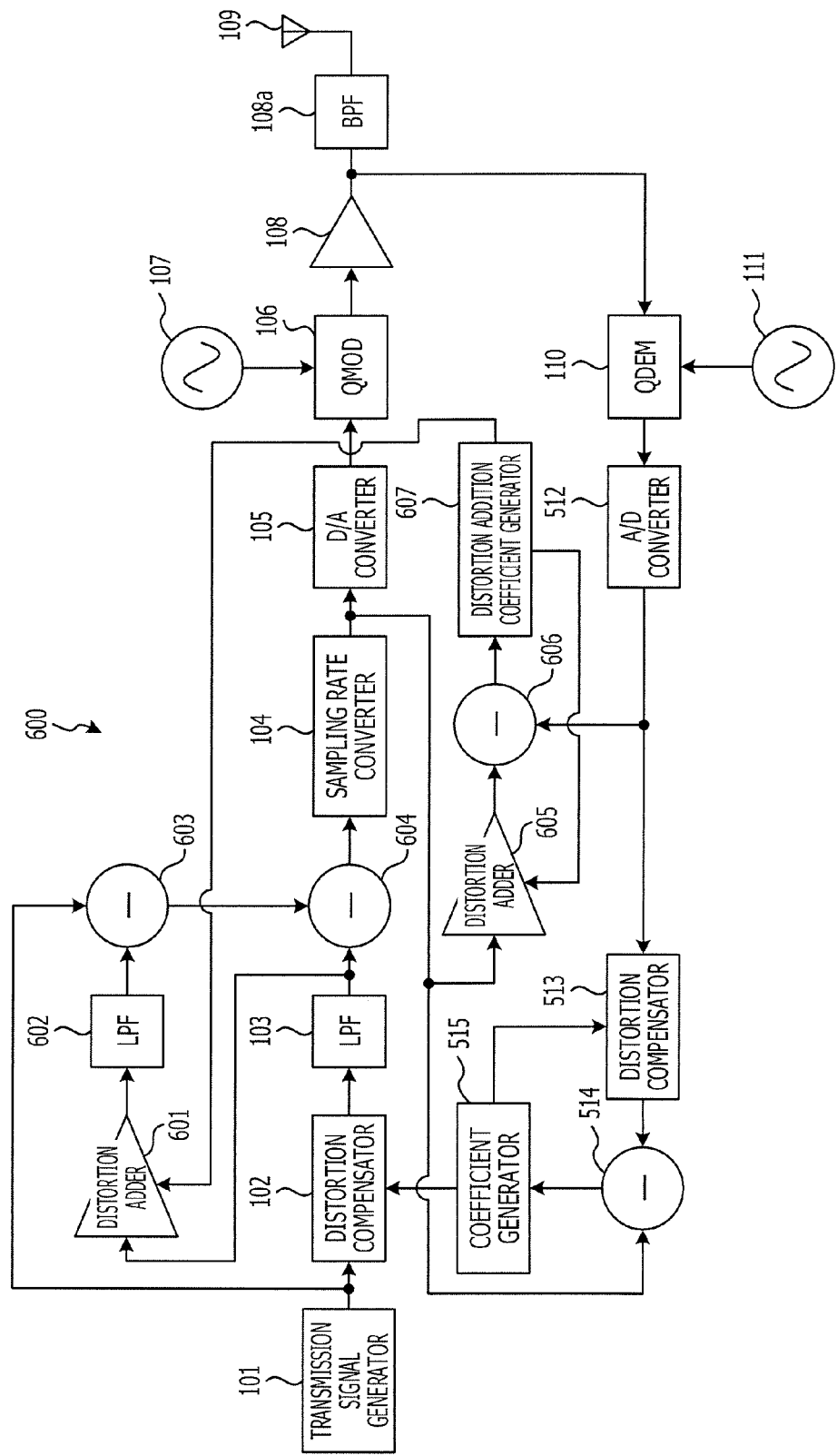
FIG. 22 illustrates an exemplary configuration of a transmitter apparatus according to a sixth embodiment.

FIG. 22 illustrates an exemplary configuration of a transmitter apparatus according to the sixth embodiment. The same reference numerals are used in FIG. 22 to identify the same components illustrated in FIG. 13. A description of such components is omitted herein. Referring to FIG. 22, a transmitter apparatus 600 according to the sixth embodiment includes a distortion adder 601, an LPF 602, a subtractor 603, a subtractor 604, a distortion adder 605, a subtractor 606, and a distortion addition coefficient generator 607, in addition to the components in the transmitter apparatus 500 illustrated in FIG. 13.

The transmission signal generator 101 in the sixth embodiment generates the transmission signal to supply the generated transmission signal to the distortion compensator 102 and the subtractor 603. The LPF 103 supplies the pre-distortion signal from which the frequency components are removed to the distortion adder 601 and the subtractor 604.

The distortion adder 601 accepts an input of the pre-distortion signal from which the frequency components are removed from the LPF 103. The distortion adder 601 accepts an input of a distortion addition coefficient from the distortion addition coefficient generator 607 described below. The distortion adder 601 multiplies the pre-distortion signal from which the frequency components are removed by the distortion addition coefficient to generate the pre-distortion signal to which the distortion characteristics simulating the distortion characteristics of the non-linear distortion of the power amplifier 108 are added. The pre-distortion signal to which the distortion characteristics simulating the distortion characteristics of the non-linear distortion of the power amplifier 108 are added is hereinafter referred to as a "distortion characteristic signal". The distortion adder 601 supplies the generated distortion characteristic signal to the LPF 602.

The LPF 602 accepts an input of the distortion characteristic signal from the distortion adder 601. The LPF 602 removes the frequency components exceeding the frequency band corresponding to the sampling rate R1 of the D/A converter 105 from the distortion characteristic signal to supply the distortion characteristic signal from which the frequency components are removed to the subtractor 603.

The subtractor 603 accepts an input of the distortion characteristic signal from the LPF 602. The subtractor 603 accepts an input of the input signal that is not subjected to the pre-distortion process, that is, an input of the transmission signal from the transmission signal generator 101. The subtractor 603 subtracts the transmission signal from the distortion characteristic signal to generate a residual signal indicating the difference between the distortion characteristic signal and the transmission signal. The distortion characteristic signal is the pre-distortion signal to which the distortion characteristics simulating the distortion characteristics of the non-linear distortion of the power amplifier 108 are added. Accordingly, the residual signal indicating the difference between the distortion characteristic signal and the transmission signal corresponds to the remaining distortion caused by the shift between the distortion characteristics of the non-linear distortion of the power amplifier 108 and the distortion characteristics of the pre-distortion signal supplied to the power amplifier 108. In other words, the subtractor 603 generates the residual signal corresponding to the remaining distortion that is not removed by the pre-distortion signal in the non-linear distortion of the power amplifier 108. The subtractor 603 is an example of a residual signal generator. The subtractor 603 supplies the generated residual signal to the subtractor 604.

The subtractor 604 accepts an input of the residual signal from the subtractor 603. The subtractor 604 accepts an input of the pre-distortion signal from which the frequency components are removed from the LPF 103. The distortion components that increase from the edges of the frequency band of the transmission signal to the edges of the frequency band, which is the transmission bandwidth of the LPF 103, appear in the pre-distortion signal from which the frequency components are removed by the LPF 103 as the remaining distortion. The subtractor 604 subtracts the residual signal corresponding to the remaining distortion from the pre-distortion signal from which the frequency components are removed by the LPF 103. In other words, the subtractor 604 inverts the sign of the residual signal corresponding to the remaining distortion and adds the residual signal the sign of which is inverted to the pre-distortion signal to offset the distortion components included in the pre-distortion signal as the remaining distortion by the residual signal corresponding to the remaining distortion. Upon offset of the distortion components included in the pre-distortion signal as the remaining distortion by the residual signal corresponding to the remaining distortion, the shift between the distortion characteristics of the pre-distortion signal supplied to the power amplifier 108 and the distortion characteristics of the non-linear distortion of the power amplifier 108 is reduced. The subtractor 604 supplies the pre-distortion signal from which the residual signal is subtracted to the sampling rate converter 104.

The sampling rate converter 104 accepts an input of the pre-distortion signal from which the frequency components are removed and from which the residual signal is subtracted from the subtractor 604. The sampling rate converter 104 converts the sampling rate of the pre-distortion signal from which the frequency components are removed and from which the residual signal is subtracted from the sampling rate R2 of the distortion compensator 102 to the sampling rate R1 of the D/A converter 105. The sampling rate converter 104 supplies the pre-distortion signal the sampling rate of which is converted to the D/A converter 105. The pre-distortion signal output from the sampling rate converter 104 is converted into the analog signal by the D/A converter 105, is up-converted by the QMOD 106, and is supplied to the power amplifier 108. Since the residual signal corresponding to the remaining distortion has been subtracted from the pre-distortion signal, the shift between the distortion characteristics of the pre-distortion signal supplied to the power amplifier 108 and the distortion characteristics of the non-linear distortion of the power amplifier 108 is reduced. Accordingly, the non-linear distortion of the power amplifier 108 is removed with the pre-distortion signal to suppress the remaining distortion appearing in the output signal from the power amplifier 108.

The distortion adder 605 accepts an input of the pre-distortion signal the sampling rate of which is converted into the sampling rate R1 of the D/A converter 105 from the sampling rate converter 104. The distortion adder 605 accepts an input of the distortion addition coefficient from the distortion addition coefficient generator 607 described below. The distortion adder 605 multiples the pre-distortion signal the sampling rate of which is converted into the sampling rate R1 of the D/A converter 105 by the distortion addition coefficient to generate the distortion characteristic signal. The distortion adder 605 supplies the generated distortion characteristic signal to the subtractor 606.

The subtractor 606 accepts an input of the distortion characteristic signal from the distortion adder 605. The subtractor 606 accepts an input of the feedback signal converted into the digital signal at the sampling rate R1 of the D/A converter 105 from the A/D converter 512. The subtractor 606 generates the error signal indicating the difference between the distortion characteristic signal and the feedback signal. The subtractor 606 supplies the generated error signal to the distortion addition coefficient generator 607.

The distortion addition coefficient generator 607 accepts an input of the error signal from the subtractor 606. The distortion addition coefficient generator 607 generates the distortion addition coefficient used for adding the distortion characteristics simulating the distortion characteristics of the non-linear distortion of the power amplifier 108 to the pre-distortion signal based on the error signal. For example, the distortion addition coefficient generator 607 generates the distortion addition coefficient by the adaptive signal process using, for example, the LMS algorithm so that the error signal is minimized. The distortion addition coefficient generator 607 supplies the generated distortion addition coefficient to the distortion adder 601 and the distortion adder 605. The distortion addition coefficient used by the distortion adder 601 and the distortion adder 605 is updated in the above manner.

Figure 23:
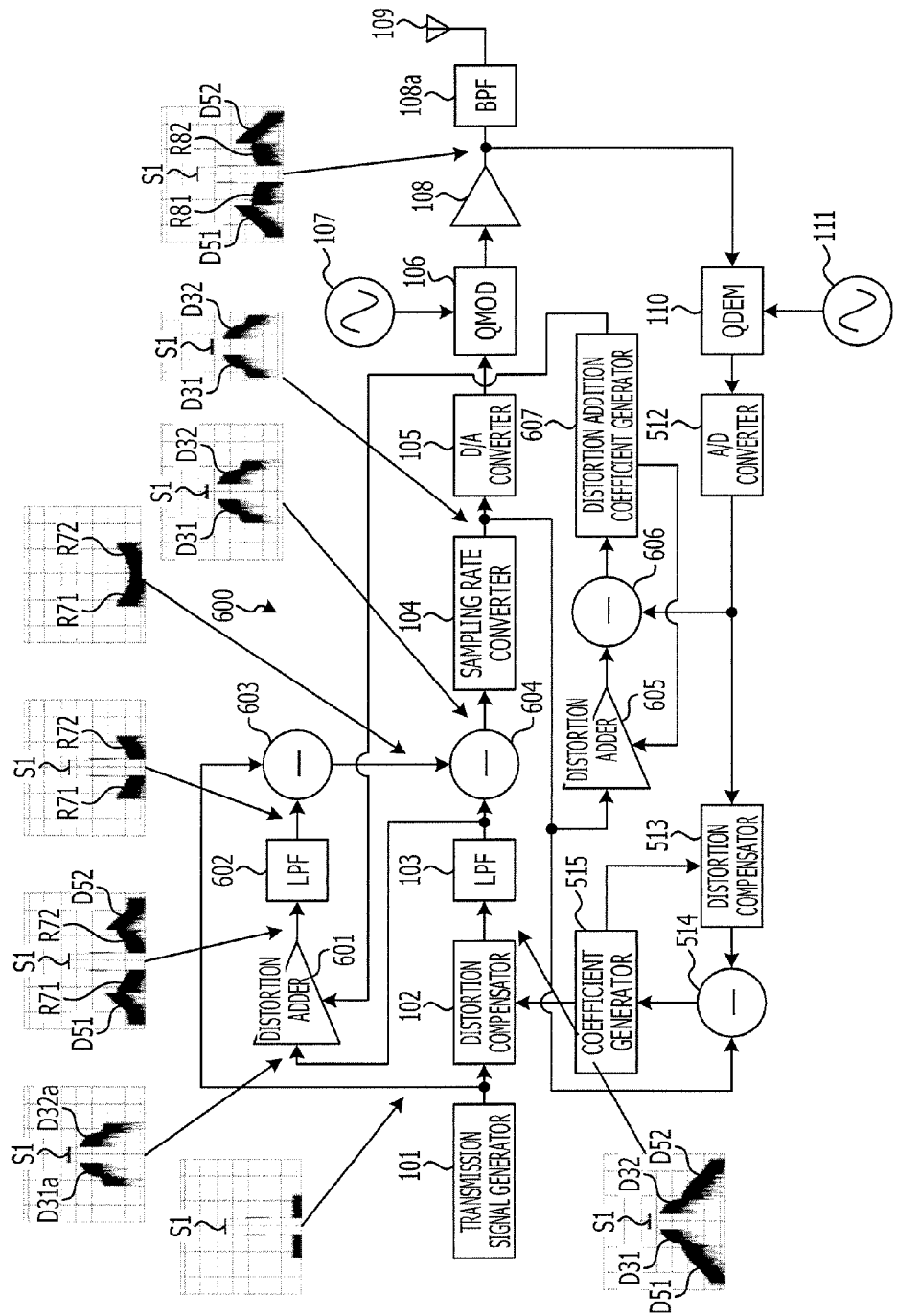
FIG. 23 is a diagram for describing an exemplary signal transmission process performed by the transmitter apparatus according to the sixth embodiment.

An exemplary signal transmission process performed by the transmitter apparatus 600 according to the sixth embodiment will now be described with reference to FIG. 23. FIG. 23 is a diagram for describing an example of the signal transmission process performed by the transmitter apparatus according to the sixth embodiment. It is assumed in the example in FIG. 23 that, as the result of the removal of the quintic distortion components of the transmission signal from the pre-distortion signal, the distortion characteristics of the pre-distortion signal supplied to the power amplifier 108 is shifted from the distortion characteristics of the non-linear distortion of the power amplifier 108.

As illustrated in FIG. 23, the transmission signal generator 101 generates the transmission signal S1 to supply the generated transmission signal S1 to the distortion compensator 102 and the subtractor 603. The distortion compensator 102 samples the transmission signal S1, which is the input signal, at the sampling rate R2 higher than the sampling rate R1 of the D/A converter 105 and multiples the sampled transmission signal S1 by the distortion compensation coefficient to generate the pre-distortion signal. The distortion compensator 102 supplies the generated pre-distortion signal to the LPF 103. The pre-distortion signal output from the distortion compensator 102 includes the transmission signal S1, the distortion components D31 and D32 including the cubic distortion components and the quintic distortion components of the transmission signal S1, and the quintic distortion components D51 and D52 of the transmission signal S1.

The LPF 103 removes the quintic distortion components D51 and D52, which are the frequency components exceeding the frequency band BF1 corresponding to the sampling rate R1 of the D/A converter 105, from the pre-distortion signal supplied from the distortion compensator 102. The LPF 103 supplies the pre-distortion signal from which the quintic distortion components D51 and D52 are removed to the distortion adder 601 and the subtractor 604. The pre-distortion signal output from the LPF 103 includes the remaining distortion caused by the shift between the distortion characteristics of the non-linear distortion of the power amplifier 108 and the distortion characteristics of the pre-distortion signal and distortion components D31a and D32a including the distortion components D31 and D32.

The distortion adder 601 multiplies the pre-distortion signal from which the quintic distortion components D51 and D52 are removed by the distortion addition coefficient to generate the pre-distortion signal to which the distortion characteristics simulating the distortion characteristics of the non-linear distortion of the power amplifier 108 are added, that is, the distortion characteristic signal. The distortion adder 601 supplies the generated distortion characteristic signal to the LPF 602. The distortion characteristic signal output from the distortion adder 601 includes the quintic distortion components D51 and D52 of the transmission signal S1 as the distortion components of the distortion characteristics simulating the distortion characteristics of the non-linear distortion of the power amplifier 108. The distortion characteristic signal output from the distortion adder 601 also includes the distortion components R71 and R72 that increase from the edges of the frequency band of the transmission signal S1 to the edges of the frequency band BF1, which is the transmission bandwidth of the LPF 103, as the remaining distortion.

The LPF 602 removes the quintic distortion components D51 and D52, which are the frequency components exceeding the frequency band BF1 corresponding to the sampling rate R1 of the D/A converter 105, from the distortion characteristics signal supplied from the distortion adder 601. The LPF 602 supplies the distortion characteristic signal from which the quintic distortion components D51 and D52 are removed to the subtractor 603.

The subtractor 603 subtracts the transmission signal S1 from the distortion characteristic signal to generate the residual signal indicating the difference between the distortion characteristic signal and the transmission signal S1. The subtractor 603 supplies the generated residual signal to the subtractor 604. The residual signal output from the subtractor 603 includes only the distortion components R71 and R72, which are the remaining distortion.

The subtractor 604 subtracts the residual signal corresponding to the remaining distortion from the pre-distortion signal from which the quintic distortion components D51 and D52 are removed by the LPF 103. As a result, the distortion components as the remaining distortion, among the distortion components D31a and D32a included in the pre-distortion signal, are offset by the residual signal corresponding to the remaining distortion. Upon offset of the distortion components included in the pre-distortion signal as the remaining distortion by the residual signal corresponding to the remaining distortion, the shift between the distortion characteristics of the pre-distortion signal supplied to the power amplifier 108 and the distortion characteristics of the non-linear distortion of the power amplifier 108 is reduced. The subtractor 604 supplies the pre-distortion signal from which the residual signal is subtracted to the sampling rate converter 104.

The sampling rate converter 104 converts the sampling rate of the pre-distortion signal from which the quintic distortion components D51 and D52 are removed and from which the residual signal is subtracted from the sampling rate R2 of the distortion compensator 102 to the sampling rate R1 of the D/A converter 105. The sampling rate converter 104 supplies the pre-distortion signal the sampling rate of which is converted to the D/A converter 105. The pre-distortion signal output from the sampling rate converter 104 is converted into the analog signal by the D/A converter 105, is up-converted by the QMOD 106, and is supplied to the power amplifier 108. Since the residual signal corresponding to the remaining distortion has been subtracted from the pre-distortion signal, the shift between the distortion characteristics of the pre-distortion signal supplied to the power amplifier 108 and the distortion characteristics of the non-linear distortion of the power amplifier 108 is reduced. Accordingly, the non-linear distortion of the power amplifier 108 is removed with the pre-distortion signal to suppress the remaining distortion appearing in the output signal from the power amplifier 108. For example, in the example in FIG. 23, distortion components R81 and R82 appearing in the output signal from the power amplifier 108 as the remaining distortion are suppressed, compared with the distortion components R71 and R72 illustrated in FIG. 21.

Figure 24:
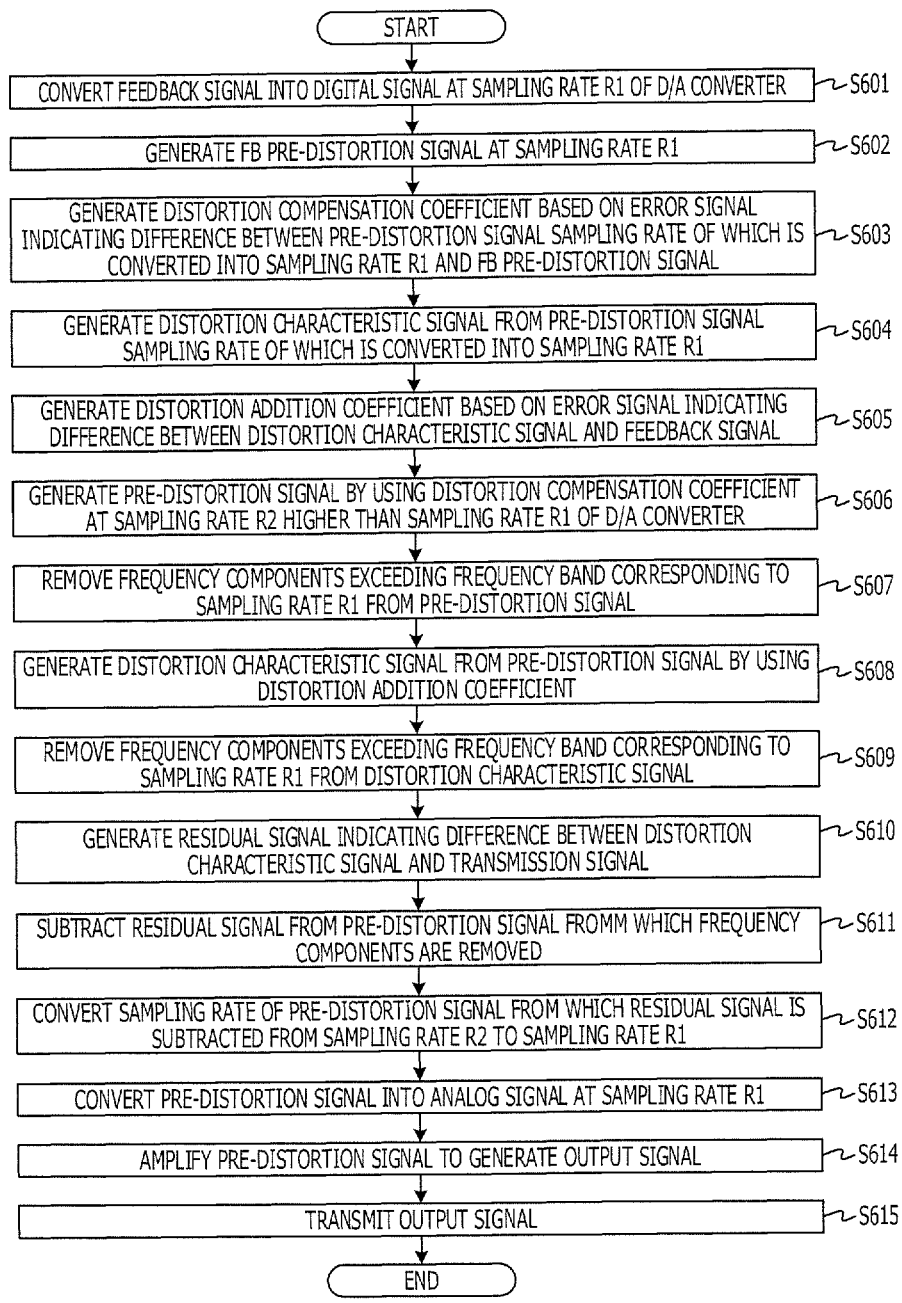
FIG. 24 is a flowchart illustrating an exemplary signal transmission process performed by the transmitter apparatus according to the sixth embodiment.

A signal transmission process performed by the transmitter apparatus 600 according to the sixth embodiment will now be described with reference to FIG. 24. FIG. 24 is a flowchart illustrating an example of the signal transmission process performed by the transmitter apparatus according to the sixth embodiment. Since Steps S601 to S603, S606, S607, and S613 to S615 illustrated in FIG. 24 are the same as Steps S501 to S503, S504, S505, and S507 to S509, respectively, illustrated in FIG. 14, a description of Steps S601 to S603, S606, S607, and S613 to S615 is omitted herein.

Referring to FIG. 24, in Step S604, the distortion adder 605 multiplies the pre-distortion signal the sampling rate of which is converted into the sampling rate R1 of the D/A converter 105 by the distortion addition coefficient to generate the distortion characteristic signal. The distortion adder 605 supplies the generated distortion characteristic signal to the subtractor 606. The subtractor 606 generates the error signal indicating the difference between the distortion characteristic signal and the feedback signal to supply the generated error signal to the distortion addition coefficient generator 607.

In Step S605, the distortion addition coefficient generator 607 generates the distortion addition coefficient for adding the distortion characteristics simulating the distortion characteristics of the non-linear distortion of the power amplifier 108 to the pre-distortion signal based on the error signal indicating the difference between the distortion characteristic signal and the feedback signal. The distortion addition coefficient generator 607 supplies the distortion addition coefficient to the distortion adder 601 and the distortion adder 605.

The distortion adder 601 accepts an input of the pre-distortion signal from which the frequency components are removed from the LPF 103. The distortion adder 601 accepts an input of the distortion addition coefficient from the distortion addition coefficient generator 607. In Step S608, the distortion adder 601 multiples the pre-distortion signal from which the frequency components are removed by the distortion addition coefficient to generate the distortion characteristic signal.

In Step S609, the LPF 602 removes the frequency components exceeding the frequency band corresponding to the sampling rate R1 of the D/A converter 105 from the distortion characteristic signal. The LPF 602 supplies the distortion characteristic signal from which the frequency components are removed to the subtractor 603.

In Step S610, the subtractor 603 generates the residual signal indicating the difference between the distortion characteristic signal and the transmission signal. The subtractor 603 supplies the residual signal to the subtractor 604.

In Step S611, the subtractor 604 subtracts the residual signal corresponding to the remaining distortion from the pre-distortion signal from which the frequency components are removed by the LPF 103. The subtractor 604 supplies the pre-distortion signal from which the residual signal is subtracted to the sampling rate converter 104.

In Step S612, the sampling rate converter 104 converts the sampling rate of the pre-distortion signal from which the residual signal is subtracted from the sampling rate R2 of the distortion compensator 102 to the sampling rate R1 of the D/A converter 105. The sampling rate converter 104 supplies the pre-distortion signal the sampling rate of which is converted to the D/A converter 105. In Step S613, the pre-distortion signal supplied from the sampling rate converter 104 is converted into the analog signal by the D/A converter 105.

The pre-distortion signal is up-converted by the QMOD 106 and is supplied to the power amplifier 108.

As described above, the transmitter apparatus 600 according to the sixth embodiment generates the residual signal indicating the difference between the transmission signal and the distortion characteristic signal, which is the pre-distortion signal to which the distortion characteristics simulating the non-linear distortion of the power amplifier 108 is added, as the signal corresponding to the remaining distortion in advance. The transmitter apparatus 600 subtracts the residual signal from the pre-distortion signal from which the frequency components are removed by the LPF 103 to supply the pre-distortion signal resulting from the subtraction to the power amplifier 108. Accordingly, since the shift between the distortion characteristics of the pre-distortion signal supplied to the power amplifier 108 and the distortion characteristics of the non-linear distortion of the power amplifier 108 is reduced, the remaining distortion appearing in the output signal from the power amplifier 108 is suppressed. As a result, it is possible to suppress the degradation of the distortion compensation performance due to the effect of the distortion other than the aliasing distortion.

Seventh Embodiment

The example in which the distortion addition coefficient is generated based on the error signal indicating the difference between the feedback signal converted into the digital signal at the sampling rate R1 of the D/A converter 105 and the distortion characteristic signal is described in the sixth embodiment. However, the distortion addition coefficient may be generated based on the error signal indicating the difference between the feedback signal the sampling rate of which is converted into the sampling rate R2 of the distortion compensator 102 and the distortion characteristic signal. In a seventh embodiment, an example in which the distortion addition coefficient is generated based on the error signal indicating the difference between the feedback signal the sampling rate of which is converted into the sampling rate R2 of the distortion compensator 102 and the distortion characteristic signal will be described.

Figure 25:
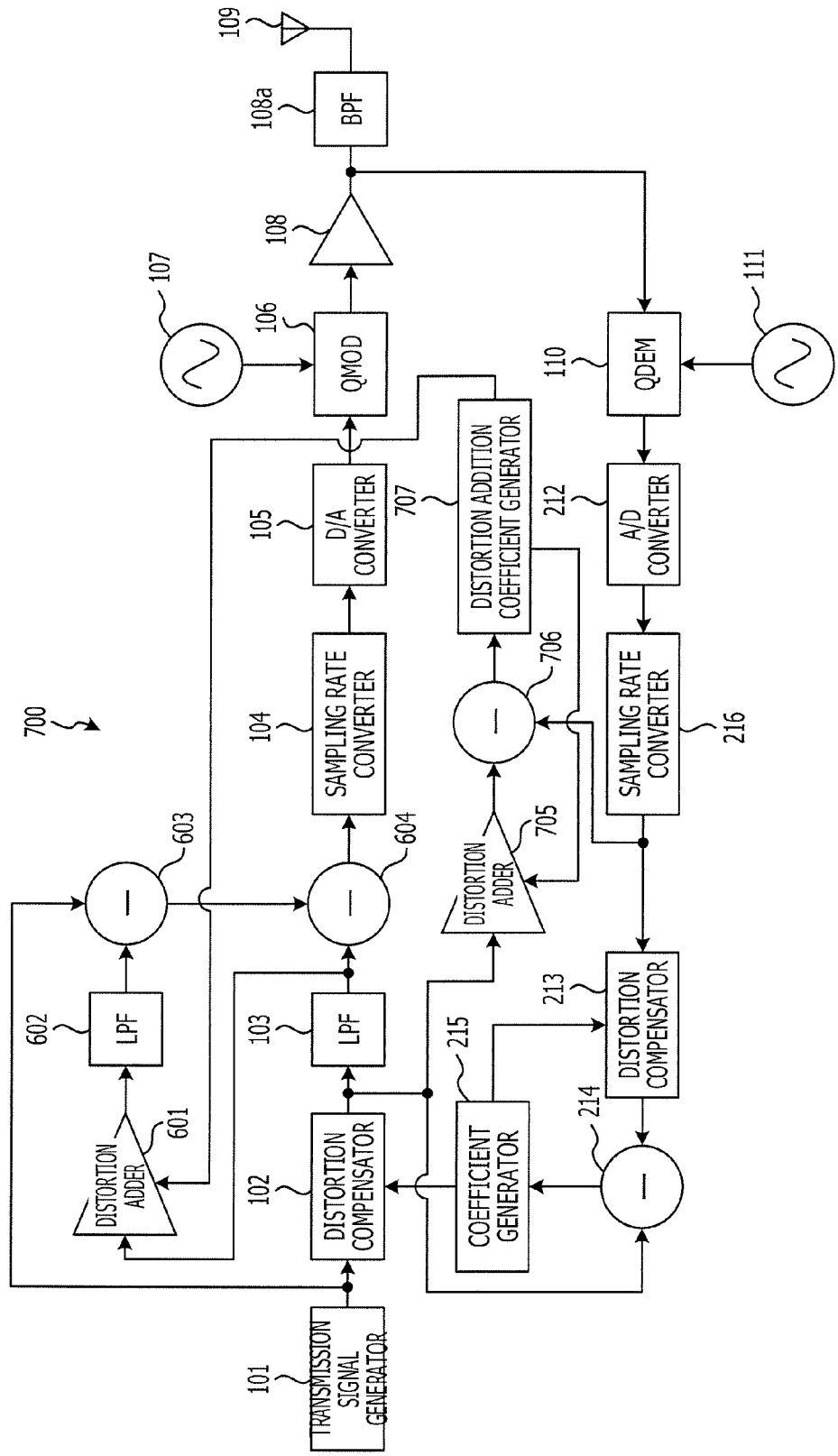
FIG. 25 illustrates an exemplary configuration of a transmitter apparatus according to a seventh embodiment.

FIG. 25 illustrates an exemplary configuration of a transmitter apparatus according to the seventh embodiment. The same reference numerals are used in FIG. 25 to identify the same components illustrated in FIG. 22. A description of such components is omitted herein. Referring to FIG. 25, a transmitter apparatus 700 according to the seventh embodiment includes the A/D converter 212, a distortion adder 705, and a subtractor 706, instead of the A/D converter 512, the distortion adder 605, and the subtractor 606 illustrated in FIG. 22. The transmitter apparatus 700 includes a distortion addition coefficient generator 707, instead of the distortion addition coefficient generator 607 illustrated in FIG. 22. The transmitter apparatus 700 includes the distortion compensator 213, the subtractor 214, and the coefficient generator 215, instead of the distortion compensator 513, the subtractor 514, and the coefficient generator 515 illustrated in FIG. 22. The transmitter apparatus 700 includes the sampling rate converter 216 between the A/D converter 212 and the distortion compensator 213.

Since the A/D converter 212, the distortion compensator 213, and the subtractor 214 basically correspond to the A/D converter 212, the distortion compensator 213, and the subtractor 214, respectively, illustrated in FIG. 7, a detailed description of the A/D converter 212, the distortion compensator 213, and the subtractor 214 is omitted herein. Since the coefficient generator 215 and the sampling rate converter 216 basically correspond to the coefficient generator 215 and the sampling rate converter 216, respectively, illustrated in FIG. 7, a detailed description of the coefficient generator 215 and the sampling rate converter 216 is omitted herein.

The distortion adder 705 accepts an input of the pre-distortion signal from the distortion compensator 102. The distortion adder 705 accepts an input of the distortion addition coefficient from the distortion addition coefficient generator 707 described below. The distortion adder 705 multiples the pre-distortion signal by the distortion addition coefficient to generate the distortion characteristic signal. The distortion adder 705 supplies the generated distortion characteristic signal to the subtractor 706.

The subtractor 706 accepts an input of the distortion characteristic signal from the distortion adder 705. The subtractor 706 accepts an input of the feedback signal the sampling rate of which is converted into the sampling rate R2 of the distortion compensator 102 from the sampling rate converter 216. The subtractor 706 generates the error signal indicating the difference between the feedback signal the sampling rate of which is converted into the sampling rate R2 of the distortion compensator 102 and the distortion characteristic signal. The subtractor 706 supplies the generated error signal to the distortion addition coefficient generator 707.

The distortion addition coefficient generator 707 accepts an input of the error signal from the subtractor 706. The distortion addition coefficient generator 707 generates the distortion addition coefficient for adding the distortion characteristics simulating the distortion characteristics of the non-linear distortion of the power amplifier 108 to the pre-distortion signal based on the error signal. For example, the distortion addition coefficient generator 707 generates the distortion addition coefficient by the adaptive signal process using, for example, the LMS algorithm so that the error signal is minimized. The distortion addition coefficient generator 707 supplies the generated distortion addition coefficient to the distortion adder 601 and the distortion adder 705. The distortion addition coefficient used by the distortion adder 601 and the distortion adder 705 is updated in the above manner.

The distortion adder 601 generates the distortion characteristic signal by using the distortion addition coefficient supplied from the distortion addition coefficient generator 707.

Figure 26:
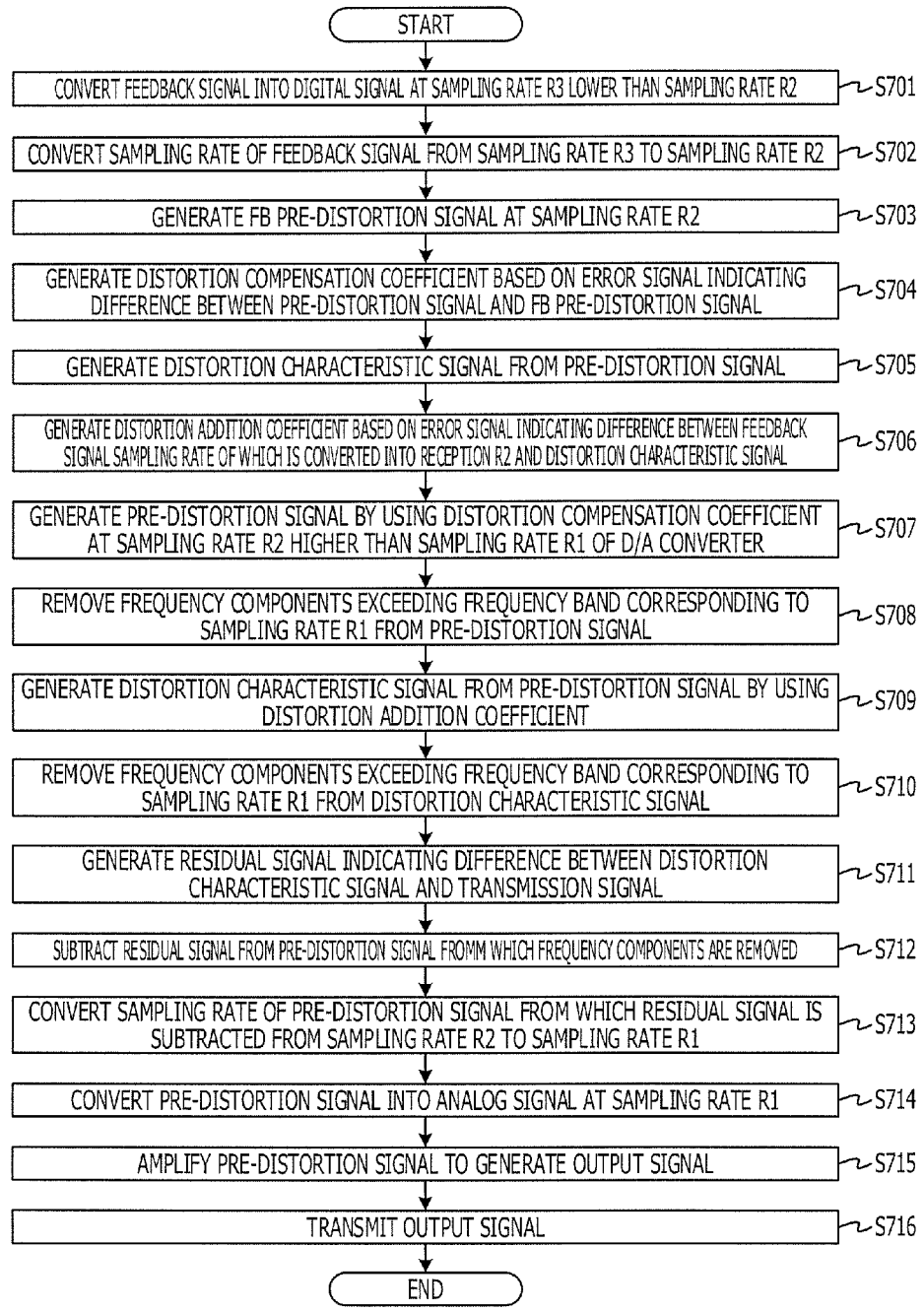
FIG. 26 is a flowchart illustrating an exemplary signal transmission process performed by the transmitter apparatus according to the seventh embodiment.

A signal transmission process performed by the transmitter apparatus 700 according to the seventh embodiment will now be described with reference to FIG. 26. FIG. 26 is a flowchart illustrating an example of the signal transmission process performed by the transmitter apparatus according to the seventh embodiment. Since Steps S707 to S716 illustrated in FIG. 26 are the same as Steps S606 to S615, respectively, illustrated in FIG. 24, a description of Steps S707 to S716 is omitted herein.

Referring to FIG. 26, in Step S701, the A/D converter 212 converts the feedback signal into the digital signal at the sampling rate R3 lower than the sampling rate R2 of the distortion compensator 102. The A/D converter 212 supplies the feedback signal converted into the digital signal to the sampling rate converter 216.

In Step S702, the sampling rate converter 216 converts the sampling rate of the feedback signal supplied from the A/D converter 212 from the sampling rate R3 of the A/D converter 212 to the sampling rate R2 of the distortion compensator 102. The sampling rate converter 216 supplies the feedback signal the sampling rate of which is converted into the sampling rate R2 to the distortion compensator 213 and the subtractor 706.

In Step 703, the distortion compensator 213 samples the feedback signal at the sampling rate R2 and multiples the sampled feedback signal by the distortion compensation coefficient to generate the FB pre-distortion signal. The distortion compensator 213 supplies the generated FB pre-distortion signal to the subtractor 214. The subtractor 214 generates the error signal indicating the difference between the pre-distortion signal supplied from the distortion compensator 102 and the FB pre-distortion signal supplied from the distortion compensator 213 to supply the generated error signal to the coefficient generator 215.

In Step S704, the coefficient generator 215 generates the distortion compensation coefficient based on the error signal supplied from the subtractor 214. The coefficient generator 215 supplies the distortion compensation coefficient to the distortion compensator 102 and the distortion compensator 213.

In Step S705, the distortion adder 705 multiples the pre-distortion signal supplied from the distortion compensator 102 by the distortion addition coefficient to generate the distortion characteristic signal. The distortion adder 705 supplies the generated distortion characteristic signal to the subtractor 706. The subtractor 706 generates the error signal indicating the difference between the feedback signal the sampling rate of which is converted into the sampling rate R2, supplied from the sampling rate converter 216, and the distortion characteristic signal supplied from the distortion adder 705 to supply the generated error signal to the distortion addition coefficient generator 707.

In Step S706, the distortion addition coefficient generator 707 generates the distortion addition coefficient based on the error signal supplied from the subtractor 706. The distortion addition coefficient generator 707 supplies the distortion addition coefficient to the distortion adder 601 and the distortion adder 705.

As described above, the transmitter apparatus 700 according to the seventh embodiment converts the feedback signal into the digital signal at the sampling rate R3 lower than the sampling rate R2 of the distortion compensator 102. The transmitter apparatus 700 converts the sampling rate of the feedback signal converted into the digital signal into the sampling rate R2 of the distortion compensator 102. The transmitter apparatus 700 generates the distortion addition coefficient based on the error signal indicating the difference between the feedback signal the sampling rate of which is converted into the sampling rate R2 and the distortion characteristic signal. Accordingly, it is possible to appropriately calculate the error signal and to appropriately update the distortion addition coefficient even when the sampling rate R3 of the A/D converter 212 at which the feedback signal is converted into the digital signal is relatively low. As a result, it is possible to appropriately suppress the remaining distortion appearing in the power amplifier 108 even when the sampling rate R1 of the D/A converter 105 and the sampling rate R3 of the A/D converter 212 are relatively low.

(Modification)

A so-called indirect learning structure in which the two distortion compensators are used to generate the distortion compensation coefficients and the two distortion adders are used to generate the distortion addition coefficients is exemplified in the sixth and seventh embodiments described above. However, one distortion compensator may be used to generate the distortion compensation coefficient and one distortion adder may be used to generate the distortion addition coefficient. The structure in which one distortion compensator is used to generate the distortion compensation coefficient and one distortion adder is used to generate the distortion addition coefficient is called a direct learning structure. In modifications of the sixth and seventh embodiments, an example in which one distortion compensator is used to generate the distortion compensation coefficient and one distortion adder is used to generate the distortion addition coefficient will be described. The modification of the seventh embodiment will be described as a representative of the modifications of the sixth and seventh embodiments.

Figure 27:
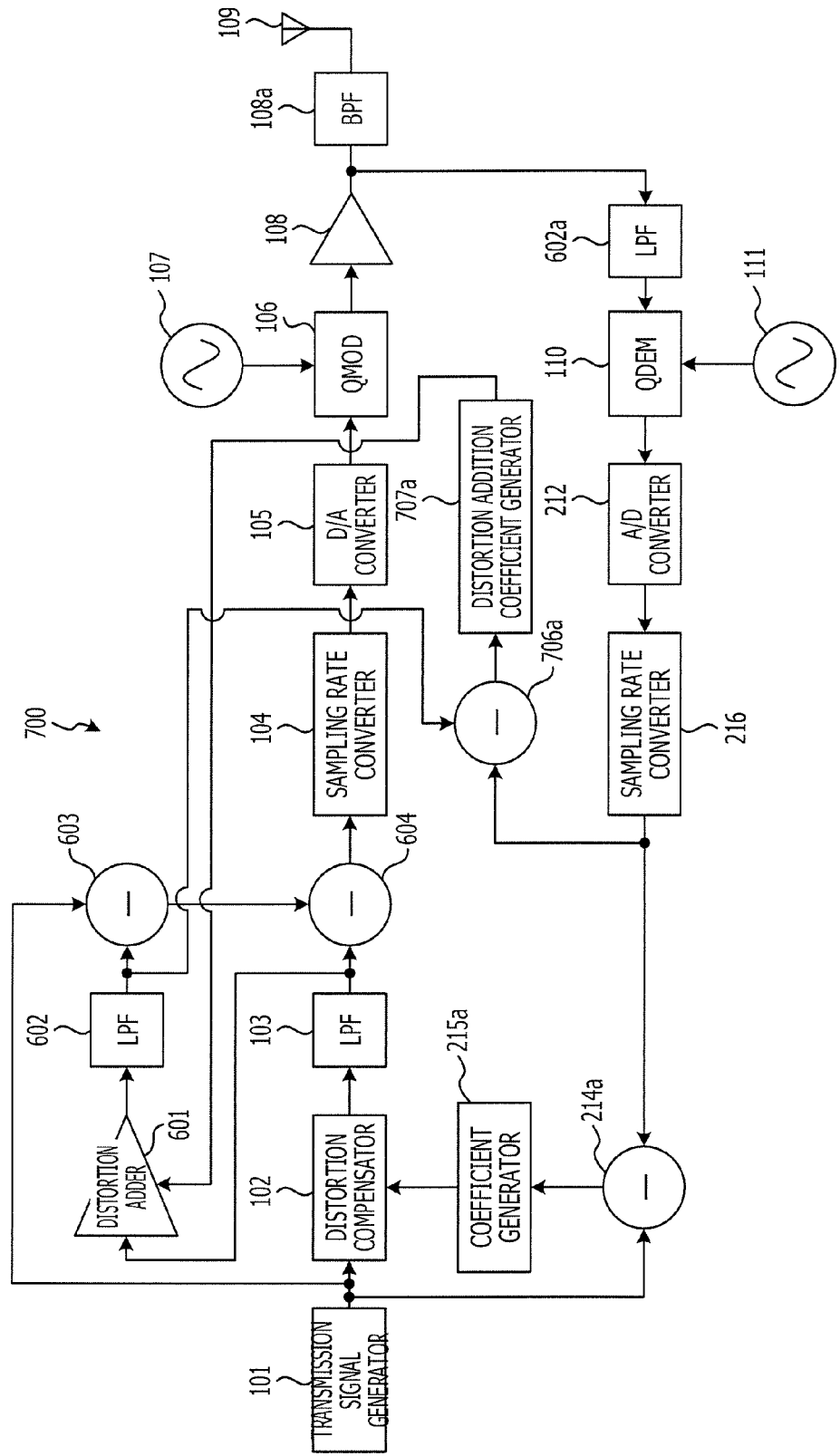
FIG. 27 illustrates an exemplary configuration of a transmitter apparatus according to a modification of the seventh embodiment.

FIG. 27 illustrates an exemplary configuration of a transmitter apparatus according to the modification of the seventh embodiment. The same reference numerals are used in FIG. 27 to identify the same components illustrated in FIG. 25. A description of such components is omitted herein. Referring to FIG. 27, the transmitter apparatus 700 according to the modification of the seventh embodiment includes the subtractor 214a and the coefficient generator 215a, instead of the subtractor 214 and the coefficient generator 215 illustrated in FIG. 25. The transmitter apparatus 700 includes a subtractor 706a and a distortion addition coefficient generator 707a, instead of the subtractor 706 and the distortion addition coefficient generator 707 illustrated in FIG. 25. The transmitter apparatus 700 includes an LPF 602a having the same function as that of the LPF 602 between the power amplifier 108 and the QDEM 110. The transmitter apparatus 700 does not include the distortion compensator 213 and the distortion adder 705 illustrated in FIG. 25.

The subtractor 214a accepts an input of the transmission signal from the transmission signal generator 101. The subtractor 214a accepts an input of the feedback signal from the sampling rate converter 216. The subtractor 214a generates the error signal indicating the difference between the transmission signal and the feedback signal. The subtractor 214a supplies the generated error signal to the coefficient generator 215a.

The coefficient generator 215a accepts an input of the error signal from the subtractor 214a. The coefficient generator 215a generates the distortion compensation coefficient based on the error signal to supply the generated distortion compensation coefficient to the distortion compensator 102. The distortion compensation coefficient used by the distortion compensator 102 is updated in the above manner.

The subtractor 706a accepts an input of the distortion characteristic signal from which the frequency components are removed from the LPF 602. The subtractor 706a accepts an input of the feedback signal from which the frequency components are removed from the sampling rate converter 216. The subtractor 706a generates the error signal indicating the difference between the distortion characteristic signal and the feedback signal. The subtractor 706a supplies the generated error signal to the distortion addition coefficient generator 707a.

The distortion addition coefficient generator 707a accepts an input of the error signal from the subtractor 706a. The distortion addition coefficient generator 707a generates the distortion addition coefficient based on the error signal to supply the generated distortion addition coefficient to the distortion adder 601. The distortion addition coefficient used by the distortion adder 601 is updated in the above manner.

As described above, the transmitter apparatus 700 according to the modification of the seventh embodiment uses one distortion compensator 102 to generate the distortion compensation coefficient and uses one distortion adder 601 to generate the distortion addition coefficient. Accordingly, it is possible to reduce the processing load of the transmitter apparatus and the size of the processing circuit.

With regard to all embodiments, the sampling rate converter 104 might be embedded in the digital-to-analog (D/A) converter 105. The sampling rate converter 104 might be provided separately from the digital-to-analog (D/A) converter 105.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power amplifier apparatus comprising:
   distortion compensator circuitry configured to perform a pre-distortion process on an input signal at a second sampling rate higher than a first sampling rate at which the input signal is converted into an analog signal;
   a remover configured to remove a frequency component exceeding a frequency band corresponding to the first sampling rate from the input signal that is subjected to the pre-distortion process;
   a first rate converter configured to convert a sampling rate of the input signal, from which the frequency component exceeding the frequency band corresponding to the first sampling rate is removed, from the second sampling rate to the first sampling rate;
   a first signal converter configured to convert the input signal, the sampling rate of which is converted into the first sampling rate and to supply the converted input signal to an amplifier configured to amplify the received input signal in an analog form;
   a second signal converter configured to convert an output signal from the amplifier into a digital signal at a third sampling rate lower than the second sampling rate; and
   a second rate converter configured to convert a sampling rate of the output signal that is converted into the digital signal, from the third sampling rate to the second sampling rate.

2. The power amplifier apparatus according to claim 1, further comprising:
   a coefficient generator configured to generate a distortion compensation coefficient based on an error signal calculated from the output signal, the sampling rate of which is converted into the second sampling rate, and the input signal that is subjected to the pre-distortion process at the second sampling rate,
   wherein the distortion compensator circuitry is further configured to perform the pre-distortion process on the input signal by using the distortion compensation coefficient generated by the coefficient generator.

3. The power amplifier apparatus according to claim 1, further comprising:
   a coefficient generator configured to generate a distortion compensation coefficient based on an error signal calculated from the output signal, the sampling rate of which is converted into the second sampling rate, and the input signal from which the frequency component exceeding the frequency band corresponding to the first sampling rate is removed,
   wherein the distortion compensator circuitry is further configured to perform the pre-distortion process on the input signal by using the distortion compensation coefficient generated by the coefficient generator.

4. A power amplifier apparatus, comprising:
   distortion compensator circuitry configured to perform a pre-distortion process on an input signal at a second sampling rate higher than a first sampling rate at which the input signal is converted into an analog signal;
   a remover configured to remove a frequency component exceeding a frequency band corresponding to the first sampling rate from the input signal that is subjected to the pre-distortion process;
   a first rate converter configured to convert a sampling rate of the input signal, from which the frequency component exceeding the frequency band corresponding to the first sampling rate is removed, from the second sampling rate to the first sampling rate;
   a first signal converter configured to convert the input signal, the sampling rate of which is converted into the first sampling rate and to supply the converted input signal to an amplifier configured to amplify the received input signal in an analog form;
   a second signal converter configured to convert an output signal from the amplifier into a digital signal at a third sampling rate lower than the second sampling rate;
   a second rate converter configured to convert the sampling rate of the input signal that is subjected to the pre-distortion process from the second sampling rate to the third sampling rate; and
   a coefficient generator configured to generate a distortion compensation coefficient based on an error signal calculated from the input signal, the sampling rate of which is converted into the third sampling rat; and the output signal converted into the digital signal at the third sampling rate,
   wherein the distortion compensator circuitry performs the pre-distortion process to the input signal by using the distortion compensation coefficient generated by the coefficient generator.

5. A power amplifier apparatus, comprising:
   distortion compensator circuitry configured to perform a pre-distortion process on an input signal at a second sampling rate higher than a first sampling rate at which the input signal is converted into an analog signal;
   a remover configured to remove a frequency component exceeding a frequency band corresponding to the first sampling rate from the input signal that is subjected to the pre-distortion process;
   a first rate converter configured to convert a sampling rate of the input signal, from which the frequency component exceeding the frequency band corresponding to the first sampling rate is removed, from the second sampling rate to the first sampling rate;
   a first signal converter configured to convert the input signal, the sampling rate of which is converted into the first sampling rate and to supply the converted input signal to an amplifier configured to amplify the received input signal in an analog form;
   a second signal converter configured to convert an output signal from the amplifier into a digital signal at the first sampling rate; and
   a coefficient generator configured to generate a distortion compensation coefficient based on an error signal calculated from the output signal that is converted into the digital signal at the first sampling rate, and the input signal, the sampling rate of which is converted into the first sampling rate, wherein the distortion compensator circuitry performs the pre-distortion process to the input signal by using the distortion compensation coefficient generated by the coefficient generator.

6. The power amplifier apparatus according to claim 1, further comprising:
   a distortion adder configured to add distortion characteristics configured to represent distortion characteristics of the amplifier to the input signal from which the frequency component is removed by the remover;
   a residual signal generator configured to generate a residual signal indicating a difference between the input signal to which the distortion characteristics are added and the input signal that is not subjected to the pre-distortion process; and
   a subtractor configured to subtract the residual signal from the input signal from which the frequency component is removed by the remover,
   wherein the first rate converter converts the sampling rate of the input signal from which the frequency component is removed by the remover and from which the residual signal is subtracted by the subtractor from the second sampling rate to the first sampling rate.

7. The power amplifier apparatus according to claim 6, further comprising:
   a distortion addition coefficient generator configured to generate a distortion addition coefficient used for adding the distortion characteristics to the input signal based on an error signal calculated from the output signal that is converted into the digital signal at the first sampling rate, and the input signal the sampling rate of which is converted into the first sampling rate and to which the distortion characteristics are added,
   wherein the distortion adder adds the distortion characteristics to the input signal from which the frequency component is removed by the remover by using the distortion addition coefficient generated by the distortion addition coefficient generator.

8. The power amplifier apparatus according to claim 6, further comprising:
   a distortion addition coefficient generator configured to generate a distortion addition coefficient to be used for adding the distortion characteristics to the input signal based on an error signal calculated from the output signal, the sampling rate of which is converted into the second sampling rate and the input signal which is subjected to the pre-distortion process at the second sampling rate and to which the distortion characteristics are added,
   wherein the distortion adder adds the distortion characteristics to the input signal from which the frequency component is removed by the remover by using the distortion addition coefficient generated by the distortion addition coefficient generator.

9. A transmitter apparatus comprising:
   a transmission signal generator configured to generate a transmission signal;
   an amplifier configured to amplify the transmission signal converted into an analog signal;
   distortion compensator circuitry configured to perform a pre-distortion process on the transmission signal at a second sampling rate higher than a first sampling rate at which the transmission signal is converted into the analog signal;
   a remover configured to remove a frequency component exceeding a frequency band corresponding to the first sampling rate from the transmission signal that is subjected to the pre-distortion process;
   a sampling rate converter configured to convert a sampling rate of the transmission signal from which the frequency component is removed from the second sampling rate to the first sampling rate;
   a signal converter configured to convert the transmission signal, the sampling rate of which is converted into the first sampling rate and to supply the converted transmission signal to an amplifier configured to amplify the received input signal in an analog form;
   a second signal converter configured to convert an output signal from the amplifier into a digital signal at a third sampling rate lower than the second sampling rate; and
   a second rate converter configured to convert a sampling rate of the output signal that is converted into the digital signal, from the third sampling rate to the second sampling rate.

10. A method of controlling a power amplifier apparatus, the method comprising:
    performing, via distortion compensator circuitry, a pre-distortion process on an input signal at a second sampling rate higher than a first sampling rate at which the input signal to be input into an amplifier is converted into an analog signal;
    removing, via a remover, a frequency component exceeding a frequency band corresponding to the first sampling rate from the input signal that is subjected to the pre-distortion process;
    converting, via a first rate converter, a sampling rate of the input signal, from which the frequency component exceeding the frequency band corresponding to the first sampling rate is removed, from the second sampling rate to the first sampling rate;
    converting, via a first signal converter, the input signal, the sampling rate of which is converted into the first sampling rate, into an analog signal to be output to the amplifier;
    amplifying, via the amplifier, the analog signal that is converted from the input signal;
    converting, via a second signal converter, an output signal from the amplifier into a digital signal at a third sampling rate lower than the second sampling rate; and
    converting, via a second rate converter, a sampling rate of the output signal that is converted into the digital signal, from the third sampling rate to the second sampling rate.

11. The power amplifier apparatus according to claim 1, further comprising:
    a coefficient generator configured to generate a distortion compensation coefficient based on an error signal calculated from the output signal, the sampling rate of which is converted into the second sampling rate, and the input signal input into the distortion compensator circuitry,
    wherein the distortion compensator circuitry is further configured to perform the pre-distortion process on the input signal by using the distortion compensation coefficient generated by the coefficient generator.

* * * * *